(12) United States Patent
In

(10) Patent No.: US 10,847,093 B2
(45) Date of Patent: Nov. 24, 2020

(54) DISPLAY APPARATUS

(71) Applicant: Samsung Display Co., Ltd., Yongin-si (KR)

(72) Inventor: Haijung In, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/374,767

(22) Filed: Apr. 4, 2019

(65) Prior Publication Data

US 2020/0035162 A1 Jan. 30, 2020

(30) Foreign Application Priority Data

Jul. 26, 2018 (KR) .......... 10-2018-0087278

(51) Int. Cl.
| | | |
|---|---|---|
| *G09G 3/3258* | (2016.01) | |
| *G09G 3/3266* | (2016.01) | |
| *G09G 3/3275* | (2016.01) | |
| *H01L 27/32* | (2006.01) | |
| *H01L 49/02* | (2006.01) | |

(52) U.S. Cl.
CPC ........ *G09G 3/3258* (2013.01); *G09G 3/3266* (2013.01); *G09G 3/3275* (2013.01); *H01L 27/3276* (2013.01); *G09G 2300/0408* (2013.01); *G09G 2300/0426* (2013.01); *G09G 2320/0219* (2013.01); *G09G 2330/025* (2013.01); *G09G 2330/08* (2013.01); *H01L 28/60* (2013.01)

(58) Field of Classification Search
CPC .. G09G 3/3258; G09G 3/3275; G09G 3/3266; G09G 2300/0426; G09G 2300/0408; G09G 2320/0219; G09G 2330/08; G09G 2330/025; G09G 2310/0286; H01L 27/3276; H01L 28/60
See application file for complete search history.

(56) References Cited

U.S. PATENT DOCUMENTS

| 9,330,593 B2 | 5/2016 | Jang | |
|---|---|---|---|
| 2003/0189542 A1 | 10/2003 | Lee et al. | |
| 2006/0061562 A1* | 3/2006 | Park .................... | G09G 3/3677 345/204 |

(Continued)

FOREIGN PATENT DOCUMENTS

| CN | 102982780 | 3/2013 |
|---|---|---|
| KR | 10-0860239 | 9/2008 |
| KR | 10-2009-0044645 | 5/2009 |

*Primary Examiner* — Brent D Castiaux
(74) *Attorney, Agent, or Firm* — H.C. Park & Associates, PLC

(57) ABSTRACT

A display apparatus includes: a substrate having a display area and a non-display area; a plurality of gate lines extending in a first direction disposed on the display area of the substrate; and a driver disposed on the non-display area, the driver including: a plurality of stages connected to the plurality of gate lines; a first voltage line and a second voltage line that are connected to the plurality of stages to respectively supply a first direct current (DC) voltage and a second DC voltage to the plurality of stages; and at least one capacitor connected to at least one of the plurality of stages, the at least one capacitor including a pair of electrodes, wherein one of the electrodes is electrically connected to one of the first voltage line and the second voltage line.

18 Claims, 20 Drawing Sheets

(56) References Cited

U.S. PATENT DOCUMENTS

| | | | |
|---|---|---|---|
| 2009/0115690 A1* | 5/2009 | Chang | G09G 3/3611 345/55 |
| 2010/0177023 A1* | 7/2010 | Han | G11C 19/184 345/76 |
| 2015/0213773 A1 | 7/2015 | Kim et al. | |
| 2017/0345366 A1 | 11/2017 | Jang | |

* cited by examiner

DISPLAY APPARATUS

CROSS-REFERENCE TO RELATED APPLICATION

This application claims priority from and the benefit of Korean Patent Application No. 10-2018-0087278, filed on Jul. 26, 2018, which is hereby incorporated by reference for all purposes as if fully set forth herein.

BACKGROUND

Field

Exemplary embodiments/implementations of the invention relate generally to a display apparatus and, more specifically, to a display apparatus including a driver.

Discussion of the Background

Display apparatuses such as an organic light-emitting display apparatus, a liquid crystal display apparatus, etc. include a display unit including a plurality of pixels and a driver driving the display unit. A driver may include a scan driver supplying scan signals to pixels in a display unit, and a data driver supplying data signals to the pixels in the display unit. The pixels may emit light to display images, based on the scan signals and data signals supplied from the scan driver and the data driver.

The above information disclosed in this Background section is only for understanding of the background of the inventive concepts, and, therefore, it may contain information that does not constitute prior art.

SUMMARY

Devices constructed according to exemplary implementations of the invention are capable of improving displaying characteristics.

Additional features of the inventive concepts will be set forth in the description which follows, and in part will be apparent from the description, or may be learned by practice of the inventive concepts.

According to one or more exemplary embodiments of the invention, a display apparatus includes: a substrate having a display area and a non-display area; a plurality of gate lines extending in a first direction and disposed on the display area of the substrate; and a driver disposed on the non-display area, the driver including: a plurality of stages connected to the plurality of gate lines; a first voltage line and a second voltage line that are connected to the plurality of stages to respectively supply a first direct current (DC) voltage and a second DC voltage to the plurality of stages; and at least one capacitor connected to at least one of the plurality of stages, the at least one capacitor including a pair of electrodes, wherein one of the electrodes is electrically connected to one of the first voltage line and the second voltage line.

The at least one capacitor may include: a first capacitor including: a first electrode including: a part of the first voltage line extending in a second direction perpendicular to the first direction; and a second electrode electrically connected to the second voltage line and overlapping the first electrode along the first voltage line; and a second capacitor including: a third electrode including a part of the second voltage line extending in the second direction perpendicular to the first direction; and a fourth electrode electrically connected to the first voltage line and overlapping the third electrode along the second voltage line.

The first voltage line may include a first main line extending in the second direction and a plurality of first connecting lines extending in the first direction to connect the first main line to the plurality of stages, and the second voltage line may include a second main line extending in the second direction and a plurality of second connecting lines extending in the first direction to connect the second main line to the plurality of stages.

The second electrode of the first capacitor may includes at least a portion of the first connecting lines intersecting the second main line.

The at least one capacitor may be provided between adjacent first connecting lines among the plurality of first connecting lines.

The at least one capacitor may be shared by at least two stages among the plurality of stages.

The first capacitor and the second capacitor may be alternately arranged in the second direction.

At least one of the plurality of first connecting lines may be arranged between the first capacitor and the second capacitor.

The display apparatus may further include: a third voltage line extending in parallel with the first voltage line, the third voltage line configured to receive a third DC voltage; and a fourth voltage line extending in parallel with the second voltage line, the fourth voltage line configured to receive a fourth DC voltage, wherein the at least one capacitor may include: a third capacitor including: a fifth electrode including a part of the third voltage line; and a sixth electrode electrically connected to the first voltage line and overlapping the fifth electrode along the third voltage line; and a fourth capacitor including: a seventh electrode including a part of the fourth voltage line; and an eighth electrode electrically connected to the second voltage line and overlapping the seventh electrode along the fourth voltage line.

At least one of the third voltage line and the fourth voltage line may be provided between the first voltage line and the second voltage line.

The first DC voltage may be equal to the third DC voltage.
The second DC voltage may be equal to the fourth DC voltage.

At least one of the third capacitor and the fourth capacitor may be shared by at least two stages among the plurality of stages.

The third capacitor and the fourth capacitor may be alternately arranged in the second direction.

According to one or more embodiments, a display apparatus includes: a plurality of stages arranged in a second direction on a substrate, the plurality of stages configured to transmit gate signals; a first voltage line including: a first main line extending in the second direction; and a plurality of first connecting lines extending in a first direction perpendicular to the second direction, the plurality of first connecting lines disposed on a different layer from the first main line connecting the first main line to the plurality of stages, and configured to supply a first direct current (DC) voltage to the plurality of stages; a second voltage line including: a second main line extending in the second direction and disposed on the same layer as the first main line; and a plurality of second connecting lines extending from the second main line in the first direction connecting the second main line to the plurality of stages, and configured to supply a second DC voltage to the plurality of stages; and at least one capacitor connected to at least one of the plurality of stages, the at least one capacitor including an electrode disposed on the same layer as the plurality of first connecting lines and electrically connected to one of the first main line and the second main line.

The at least one capacitor may include: a first capacitor including: a first electrode including a part of the first main line; and a second electrode electrically connected to the second main line and overlapping the first electrode along the first main line; and a second capacitor including: a third electrode including a part of the second main line; and a fourth electrode electrically connected to the first main line and overlapping the third electrode along the second main line.

At least one of the first capacitor and the second capacitor may be shared by at least two stages among the plurality of stages.

The display apparatus may further include: a third voltage line extending in parallel with the first voltage line, the third voltage line configured to receive a third DC voltage; and a fourth voltage line extending in parallel with the second voltage line, the fourth voltage line configured to receive a fourth DC voltage, wherein the at least one capacitor may include: a third capacitor including: a fifth electrode including a part of the third voltage line; and a sixth electrode electrically connected to the first main line and overlapping the fifth electrode along the third voltage line; and a fourth capacitor including: a seventh electrode including a part of the fourth voltage line; and an eighth electrode electrically connected to the second main line and overlapping the seventh electrode along the fourth voltage line.

The first DC voltage may be equal to the third DC voltage.

The second DC voltage may be equal to the fourth DC voltage.

At least one of the third capacitor and the fourth capacitor may be shared by at least two stages among the plurality of stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
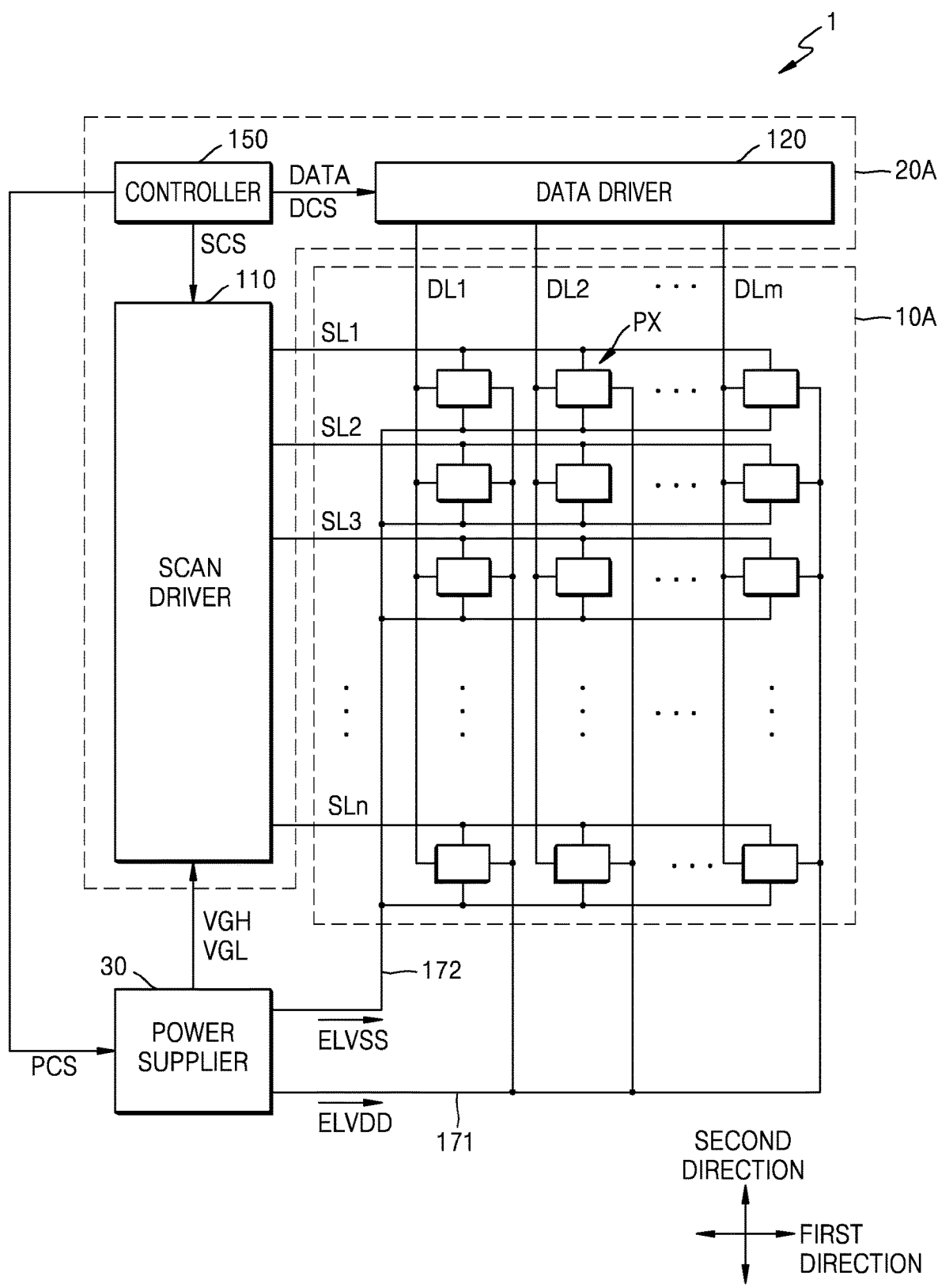
FIG. 1 is a block diagram illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction and the second direction are not limited to a rectangular coordinate system, such as the x, y, and z-axes, and may be interpreted in a broader sense. For example, the first direction and the second direction may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display apparatus 1 according to an exemplary embodiment.

Referring to FIG. 1, the display apparatus 1 according to the exemplary embodiment may include a display unit 10A, a driver 20A, and a power supplier 30.

The display apparatus 1 may include a liquid crystal display, an organic light-emitting display, an electrophoretic display, an electrowetting display, etc. Hereinafter, an organic light-emitting display will be described as an example.

The display unit 10A may include a plurality of data lines DL1 to DLm, a plurality of scan lines SL1 to SLn, and a plurality of pixels PX. The plurality of scan lines SL1 to SLn may be arranged in a first direction, and the plurality of data lines DL1 to DLm may be arranged in a second direction. Each of the plurality of pixels PX may be connected to a corresponding data line of the plurality of data lines DL1 to DLm and a corresponding scan line of the plurality of scan lines SL1 to SLn, to receive a data signal and a scan signal. The pixel PX may include a light-emitting device and a pixel circuit electrically connected to the light-emitting device.

The driver 20A may control an operation of displaying images on the display unit 10A. The driver 20A includes a scan driver 110, a data driver 120, and a controller 150.

The scan driver 110 receives a scan driver control signal SCS from the controller 150, generates scan signals corresponding to the scan driver control signal SCS, and supplies the scan signals to the plurality of scan lines SL1 to SLn.

The data driver 120 may receive image data DATA and a data driver control signal DCS from the controller 150, generate data signals corresponding to the image data DATA and the data driver control signal DCS, and may supply the data signals to the plurality of data lines DL1 to DLm.

The controller 150 may control the scan driver 110, the data driver 120, and the power supplier 30. The controller 150 may generate the scan driver control signal SCS, the data driver control signal DCS, and a power supply control signal PCS based on a control signal from outside, to control the scan driver 110, the data driver 120, and the power supplier 30.

According to an exemplary embodiment, the driver 20A may be directly on a non-display area of a substrate, which is outside the display unit 10A. According to another exemplary embodiment, the driver 20A may be connected to the display unit 10A via an additional elements (e.g., a circuit board). In another exemplary embodiment, a part of the driver 20A (e.g., the scan driver) may be directly on the non-display area, and remaining part of the driver 20A may be connected to the display unit 10A via an additional element (e.g., circuit board). The driver 20A on the non-display area may be manufactured simultaneously with manufacturing of the pixel circuit of the display unit 10A.

The power supplier 30 may supply a first power voltage ELVDD and a second power voltage ELVSS to each of the pixels PX via a first power line 171 and a second power line 172. The first power voltage ELVDD and the second power voltage ELVSS may be different from each other. The second power voltage ELVSS may be lower than the first power voltage ELVDD. For example, the first power voltage ELVDD may be a positive voltage and the second power voltage ELVSS may be a negative voltage or a ground voltage.

The power supplier 30 may supply a first driving voltage VGH and a second driving voltage VGL to the scan driver 110. The first driving voltage VGH and the second driving voltage VGL may be different from each other. For example, the first driving voltage VGH may be a positive voltage that is greater than the first power voltage ELVDD and the second driving voltage VGL may be a negative voltage that is less than the second power voltage ELVSS.

Figure 2:
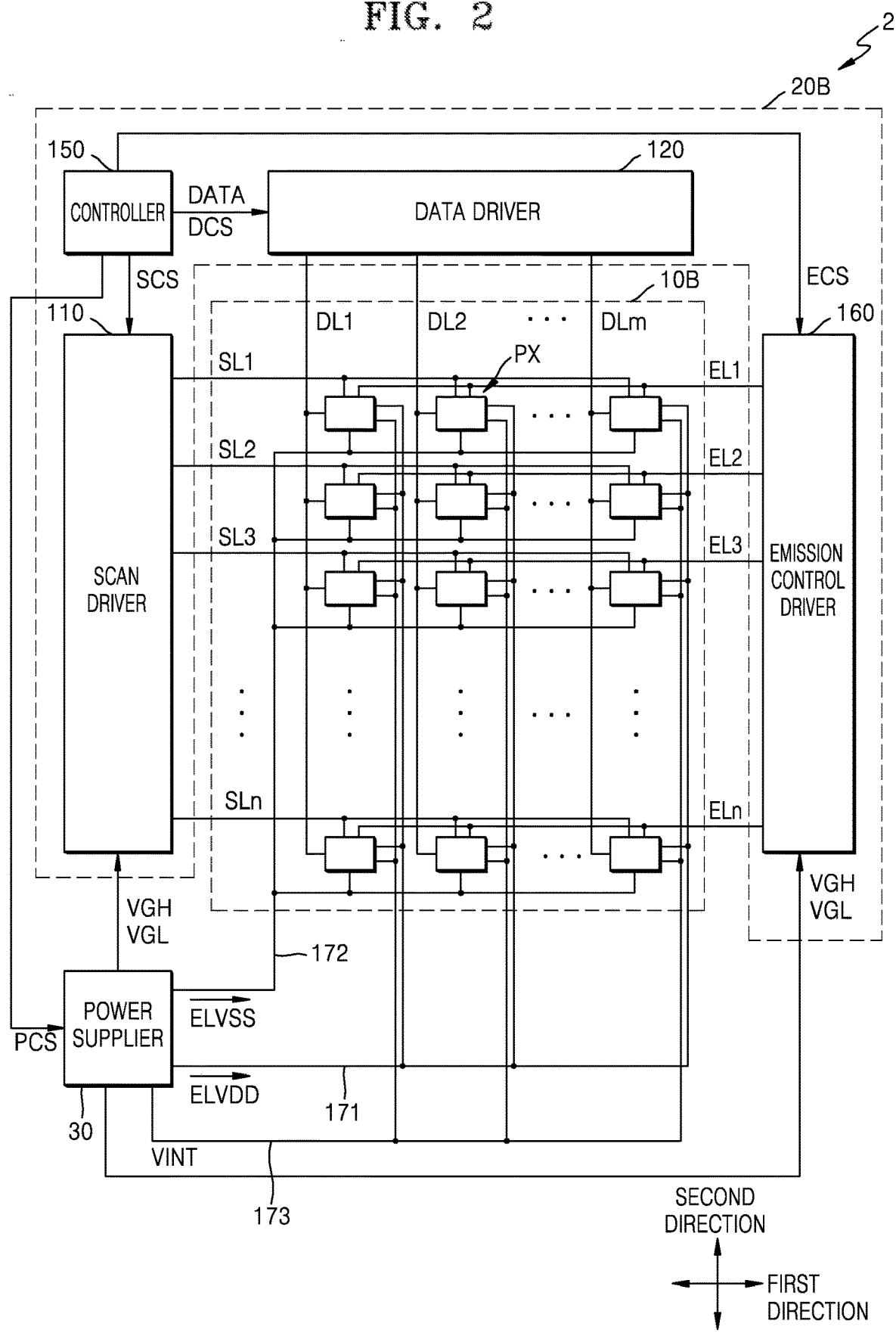
FIG. 2 is a block diagram illustrating a display apparatus according to another exemplary embodiment.

FIG. 2 is a block diagram illustrating a display apparatus 2 according to another exemplary embodiment.

Referring to FIG. 2, the display apparatus 2 may include a display unit 10B, a driver 20B, an emission control driver 160, and the power supplier 30.

The display apparatus 2 may include a liquid crystal display, an organic light-emitting display, an electrophoretic display, an electrowetting display, etc. Hereinafter, an organic light-emitting display will be described as an example.

The display unit 10B may include a plurality of data lines DL1 to DLm, a plurality of scan lines SL1 to SLn, a plurality of emission control lines EL1 to ELn, and a plurality of pixels PX. The plurality of scan lines SL1 to SLn and the plurality of emission control lines EL1 to ELn are arranged along a first direction, and the plurality of data lines DL1 to DLm may be arranged along a second direction. Each of the plurality of pixels PX may be connected to a corresponding scan line of the plurality of scan lines SL1 to SLn, a corresponding data line of the plurality of data lines DL1 to DLm, and a corresponding emission control line of the plurality of emission control lines EL1 to ELn to receive a scan signal, a data signal, and an emission control signal.

The driver 20B may control an operation of displaying images on the display unit 10B. The driver 20B includes a scan driver 110, a data driver 120, the emission control driver 160, and a controller 150.

The scan driver 110 receives a scan driver control signal SCS from the controller 150, generates scan signals corresponding to the scan driver control signal SCS, and supplies the scan signals to the plurality of scan lines SL1 to SLn.

The data driver 120 may receive image data DATA and a data driver control signal DCS from the controller 150, generate data signals corresponding to the image data DATA and the data driver control signal DCS, and may supply the data signals to the plurality of data lines DL1 to DLm.

The emission control driver 160 receives an emission control driver control signal ECS from the controller 150, generates emission control signals in response to the signal ECS, and may supply the emission control signals to the emission control lines EL1 to ELn.

The controller 150 may control the scan driver 110, the data driver 120, the emission control driver 160, and the power supplier 30. The controller 150 may generate the scan driver control signal SCS, the data driver control signal DCS, a power supply control signal PCS, and an emission control driver control signal ECS based on a control signal from outside, to control the scan driver 110, the data driver 120, the emission control driver 160, and the power supplier 30.

According to an exemplary embodiment, the driver 20B may be directly on a non-display area of a substrate, which is outside the display unit 10B. According to another exemplary embodiment, the driver 20B may be connected to the display unit 10B via an additional elements (e.g., a circuit board). In another exemplary embodiment, a part of the driver 20B (e.g., the scan driver and/or the emission control driver) may be directly on the non-display area, and remaining part of the driver 20B may be connected to the display unit 10B via an additional element (e.g., circuit board). The driver 20B on the non-display area may be manufactured simultaneously with manufacturing of the pixel circuit of the display unit 10B.

The power supplier 30 may supply a first power voltage ELVDD and a second power voltage ELVSS to each of the pixels PX via a first power line 171 and a second power line 172. The first power voltage ELVDD and the second power voltage ELVSS may be different from each other. The second power voltage ELVSS may be lower than the first power voltage ELVDD. For example, the first power voltage ELVDD may be a positive voltage and the second power voltage ELVSS may be a negative voltage or a ground voltage.

The power supplier 30 may supply a first driving voltage VGH and a second driving voltage VGL to the scan driver 110 and the emission control driver 160. The first driving voltage VGH and the second driving voltage VGL may be different from each other. For example, the first driving voltage VGH may be a positive voltage that is greater than the first power voltage ELVDD and the second driving voltage VGL may be a negative voltage that is less than the second power voltage ELVSS.

In FIG. 2, the power supplier 30 supplies the first driving voltage VGH and the second driving voltage VGL to the scan driver 110 and the emission control driver 160, but in another exemplary embodiment, the power supplier 30 may supply a third driving voltage and a fourth driving voltage to the emission control driver 160, wherein the third and fourth driving voltages are different from the first driving voltage VGH and the second driving voltage VGL supplied to the scan driver 110.

The scan driver 110 and the emission control driver 160 shown in FIGS. 1 and 2 may be implemented as shift registers each including a plurality of stages ST1 to STn.

Figure 3:
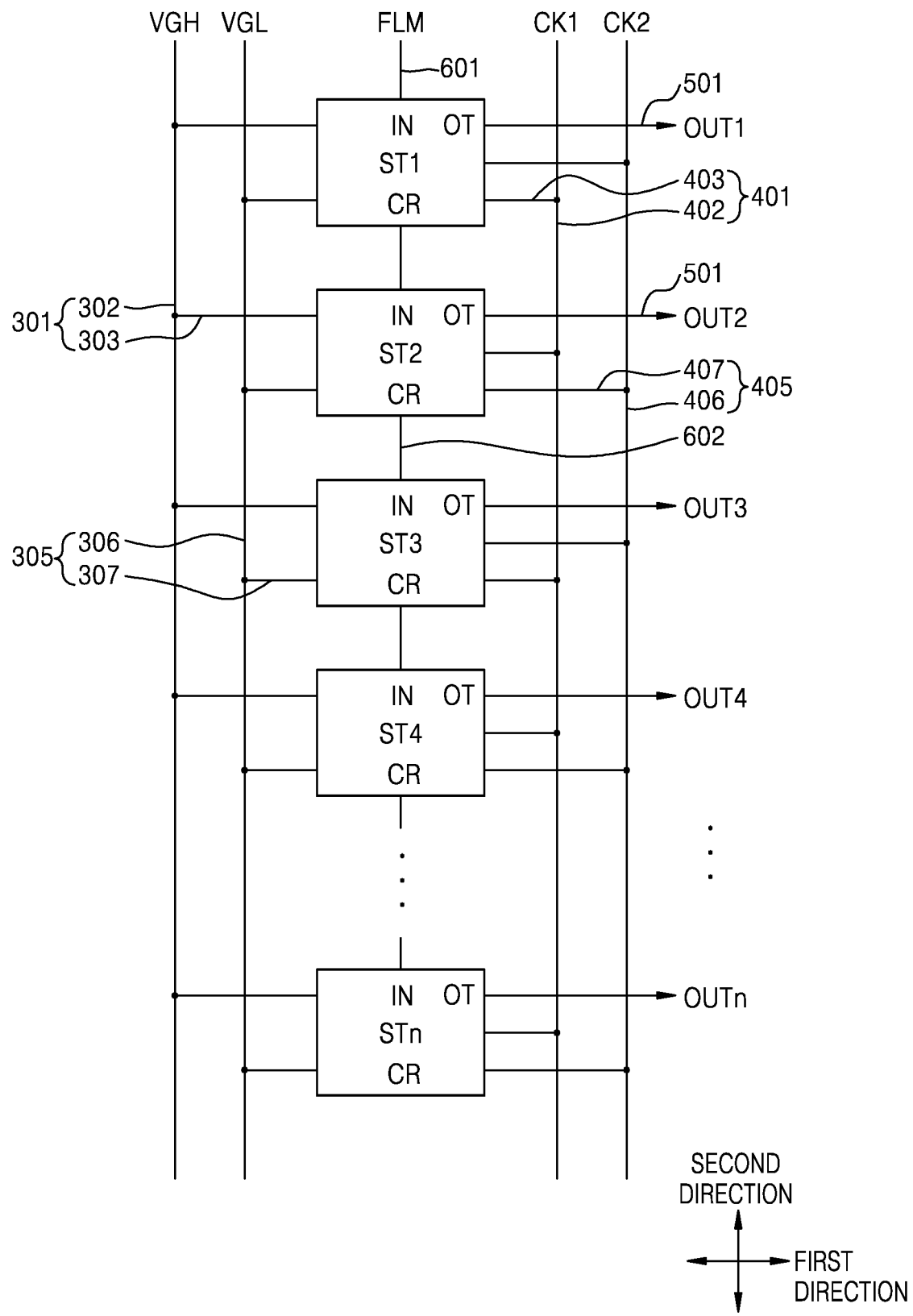
FIG. 3 is a block diagram illustrating a scan driver and an emission control driver, according to an exemplary embodiment.
Figure 4:
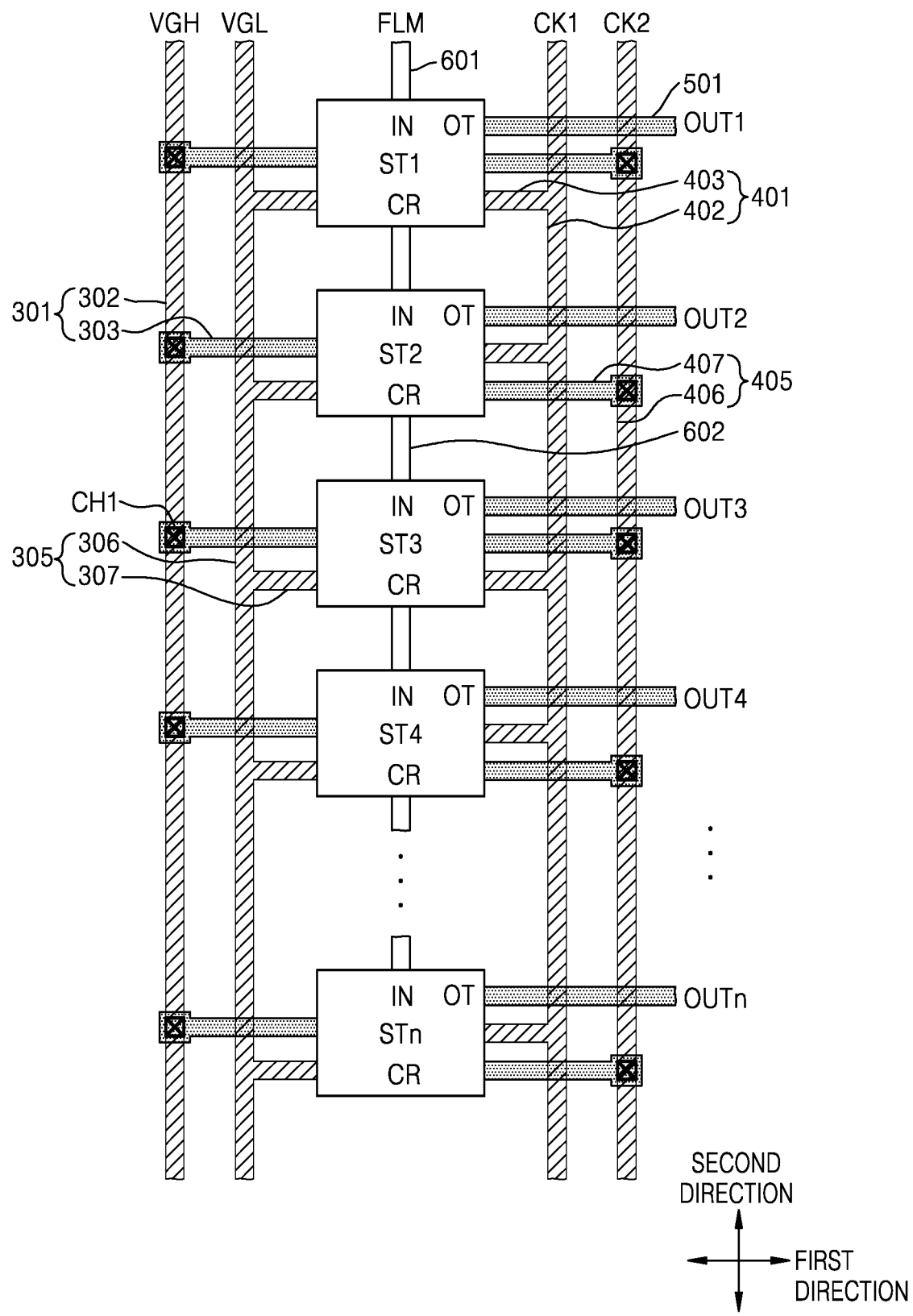
FIG. 4 is a plan view showing wirings of a scan driver and an emission control driver in detail, according to an exemplary embodiment.

FIG. 3 is a block diagram illustrating the scan driver 110 and the emission control driver 160 according to an exemplary embodiment. FIG. 4 is a plan view showing wirings of the scan driver 110 and the emission control driver 160 in detail according to an exemplary embodiment.

The scan driver 110 and the emission control driver 160 may be directly on the substrate. The scan driver 110 and the emission control driver 160 may each include the plurality of stages ST1 to STn, and each of the plurality of stages ST1 to STn may output the output signals OUT1 to OUTn via an output terminal OT. In the case of the scan driver 110, output terminals OT are connected to the plurality of scan lines SL1 to SLn, and may supply scan signals to the plurality of scan lines SL1 to SLn as output signals OUT1 to OUTn. The scan signal may be supplied to the pixels PX via the plurality of scan lines SL1 to SLn. In the case of the emission control driver 160, the output terminals OT are connected to the emission control lines EL1 to ELn, and may supply emission control signals to the emission control lines EL1 to ELn as output signals OUT1 to OUTn. The emission control signal may be supplied to the pixels PX via the emission control lines EL1 to ELn.

Each of the plurality of stages ST1 to STn may be connected to a plurality of wirings arranged on an outer portion of the plurality of stages ST1 to STn. The plurality of wirings may include voltage lines including a first driving voltage line 301 and a second driving voltage line 305, and clock lines including a first clock line 401 and a second clock line 405. Each of the plurality of wirings may be connected to a corresponding stage of the plurality of stages ST1 to STn via connecting lines. In FIG. 3, only two voltage lines and two clock lines are shown, but two or more voltage lines and/or two or more clock lines may be connected to the plurality of stages according to a configuration of circuits constituting each of the plurality of stages.

The first and second driving voltage lines 301 and 305 and the first and second clock lines 401 and 405 may be separately arranged at left and right sides with respect to the plurality of stages ST1 to STn, so that the connecting lines of the voltage lines may not overlap the clock lines. In one exemplary embodiment, the first driving voltage line 301 and the second driving voltage line 305 may be separately arranged in parallel with each other at a left side of the plurality of stages ST1 to STn. The first clock line 401 and the second clock line 405 may be separately arranged in parallel with each other at a right side of the plurality of stages ST1 to STn. In another exemplary embodiment, the first driving voltage line 301 and the second driving voltage line 305 may be separately arranged in parallel with each other at a right side of the plurality of stages ST1 to STn. The first clock line 401 and the second clock line 405 may be separately arranged in parallel with each other at a left side of the plurality of stages ST1 to STn.

In one exemplary embodiment, the second driving voltage line 305 is closer to the plurality of stages ST1 to STn than the first driving voltage line 301. In another exemplary embodiment, the first driving voltage line 301 is closer to the plurality of stages ST1 to STn than the second driving voltage line 305.

The first driving voltage line 301 is connected between the power supplier 30 and the plurality of stages ST1 to STn, in order to transfer the first driving voltage VGH from the power supplier 30 to the plurality of stages ST1 to STn. The first driving voltage line 301 may include a first main line 302 and a plurality of first connecting lines 303. The first main line 302 may extend in the second direction. The first connecting lines 303 are arranged at a different layer from the first main line 302 and may be electrically connected to the first main line 302 through the first contact hole CH1. The first connecting lines 303 may extend in the first direction to intersect a second main line 306 of the second driving voltage line 305. Each of the first connecting lines 303 may connect the first main line 302 to a corresponding stage of the plurality of stages ST1 to STn. The number of the first connecting lines 303 may be equal to the number of the plurality of stages ST1 to STn.

The second driving voltage line 305 is connected between the power supplier 30 and the plurality of stages ST1 to STn, in order to transfer the second driving voltage VGL from the power supplier 30 to the plurality of stages ST1 to STn. The second driving voltage line 305 may include the second main line 306 and a plurality of second connecting lines 307. The second main line 306 may extend in the second direction. The second connecting lines 307 may protrude from the second main line 306 to extend in the first direction. Each of the second connecting lines 307 may connect the second main line 306 to a corresponding stage of the plurality of stages ST1 to STn. The number of the second connecting lines 307 may be equal to the number of the plurality of stages ST1 to STn.

The first clock line 401 is connected between the controller 150 and the plurality of stages ST1 to STn, in order to transfer a first clock signal CK1 from the controller 150 to the plurality of stages ST1 to STn. The first clock line 401 may include a third main line 402 and a plurality of third connecting lines 403. The third main line 402 may extend in the second direction. The third connecting lines 403 may protrude from the third main line 402 and extend in the first direction. Each of the third connecting lines 403 may connect the third main line 402 to a corresponding stage of the plurality of stages ST1 to STn. The number of the third connecting lines 403 may be equal to the number of the plurality of stages ST1 to STn.

The second clock line 405 is connected between the controller 150 and the plurality of stages ST1 to STn, in order to transfer a second clock signal CK2 from the controller 150 to the plurality of stages ST1 to STn. The second clock line 405 may include the fourth main line 406 and a plurality of fourth connecting lines 407. The fourth main line 406 may extend in the second direction. The fourth connecting lines 407 are arranged at a different layer from the fourth main line 406 and may be electrically connected to the fourth main line 406 through a contact hole. The fourth connecting lines 407 extend in the first direction to intersect with the third main line 402 of the first clock line 401. Each of the fourth connecting lines 407 may connect the fourth main line 406 to a corresponding stage of the plurality of stages ST1 to STn. The number of the fourth connecting lines 407 may be equal to the number of the plurality of stages ST1 to STn.

Among the plurality of stages ST1 to STn, a first stage ST1 may receive a starting signal FLM from a starting signal line 601 via an input terminal IN. The stages ST2 to STn other than the first stage ST1 may receive a carry signal from a carry line 602 connected to a carry output terminal CR of corresponding previous stages ST1 to STn−1, via the input terminal IN as a starting signal. The carry signal may be an output signal OUT of a previous stage.

The starting signal line 601 and the carry line 602 may be disposed on the same layer as those of the first to fourth main lines 302, 306, 402, and 406.

Output lines 501 connected to the output terminals OT of the plurality of stages ST1 to STn extend in the first direction, and may be disposed on a different layer from those of the first to fourth main lines 302, 306, 402, and 406. The output lines 501 may be disposed on the same layer as or different layer from those of the first connecting lines 303. In one exemplary embodiment, the output lines 501 may be electrically connected to the plurality of scan lines SL1 to SLn or the emission control lines EL1 to ELn. In another exemplary embodiment, the output lines 501 may be the plurality of scan lines SL1 to SLn or the emission control lines EL1 to ELn.

Figure 5:
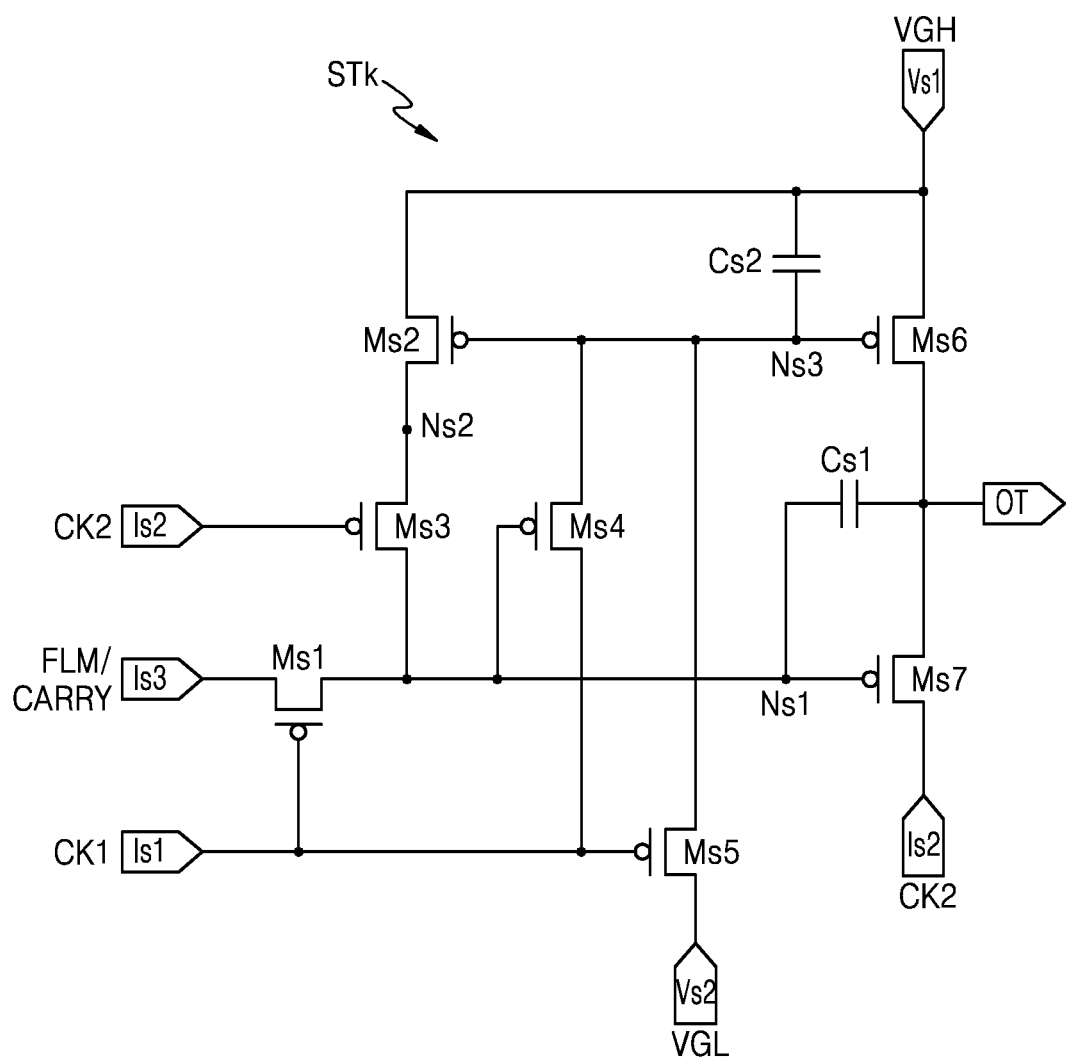
FIG. 5 is a diagram of an exemplary stage in a scan driver according to an exemplary embodiment.

FIG. 5 is a diagram of an exemplary stage in a scan driver according to an exemplary embodiment. Hereinafter, a k-th stage STk will be described below, and configurations and operations of the k-th stage STk may be identically applied to remaining stages.

Referring to FIG. 5, a k-th stage STk of the scan driver 110 according to the exemplary embodiment may include a first transistor Ms1, a second transistor Ms2, a third transistor Ms3, a fourth transistor Ms4, a fifth transistor Ms5, a sixth transistor Ms6, a seventh transistor Ms7, a first capacitor Cs1, and a second capacitor Cs2.

The first transistor Ms1 is connected between a third input terminal Is3 and a first node Ns1, and may include a gate electrode connected to the first input terminal Is1. The first transistor Ms1 may be turned on or turned off according to a voltage level of the first input terminal Is1.

The second transistor Ms2 may be connected between a second node Ns2 and a first voltage terminal Vs1, and may include a gate electrode connected to a third node Ns3. The second transistor Ms2 may be turned on or turned off according to a voltage level of the third node Ns3.

The third transistor Ms3 is connected between the first node Ns1 and the second node Ns2, and may include a gate electrode connected to the second input terminal Is2. The third transistor Ms3 may be turned on or turned off according to a voltage level of the second input terminal Is2.

The fourth transistor Ms4 is connected between the third node Ns3 and the first input terminal Is1, and may include a gate electrode connected to the first node Ns1. The fourth transistor Ms4 may be turned on or turned off according to a voltage level of the first node Ns1.

The fifth transistor Ms5 is connected between the third node Ns3 and a second voltage terminal Vs2, and may include a gate electrode connected to the first input terminal Is1. The fifth transistor Ms5 may be turned on or turned off according to a voltage level of the first input terminal Is1.

The sixth transistor Ms6 is connected between the first voltage terminal Vs1 and the output terminal OT, and may include a gate electrode connected to the third node Ns3. The sixth transistor Ms6 may be turned on or turned off according to a voltage level of the third node Ns3.

The seventh transistor Ms7 is connected between the output terminal OT and the second input terminal Is2, and may include a gate electrode connected to the first node Ns1. The seventh transistor Ms7 may be turned on or turned off according to a voltage level of the first node Ns1.

The output terminal OT may be connected to a k-th scan line SLk.

The first capacitor Cs1 may be connected between the first node Ns1 and the output terminal OT. The second capacitor Cs2 may be connected between the first voltage terminal Vs1 and the third node Ns3.

The first voltage terminal Vs1 may be connected to the first driving voltage line 301 to receive the first driving voltage VGH. The second voltage terminal Vs2 may be connected to the second driving voltage line 305 to receive the second driving voltage VGL. At an odd-numbered stage, the first input terminal Is1 is connected to the first clock line 401 to receive the first clock signal CK1, and the second input terminal Is2 is connected to the second clock line 405 to receive the second clock signal CK2. At an even-numbered stage, the first input terminal Is1 is connected to the second clock line 405 to receive the second clock signal CK2, and the second input terminal Is2 is connected to the first clock line 401 to receive the first clock signal CK1. Among the plurality of stages ST1 to STn, a third input terminal Is3 of a circuit in the first stage ST1 is connected to the starting signal line 601 to receive an input of a starting signal FLM1. The third input terminal Is3 in each of the other stages ST2 to STn than the first stage ST1 may be connected to a carry output terminal CR of a previous stage ST1 to STn−1 via the carry line 602 to receive a carry signal CARRY as a starting signal.

Figure 6:
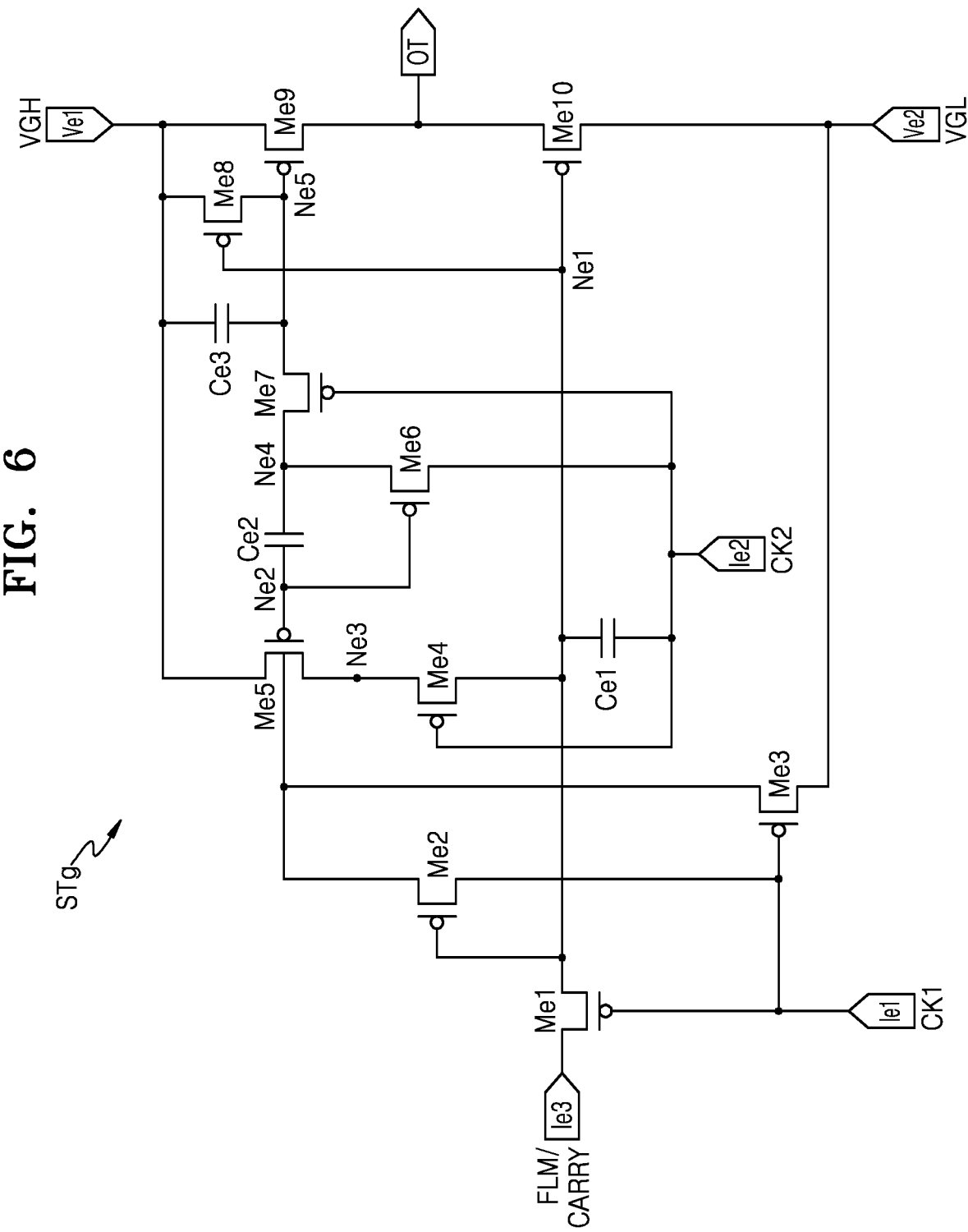
FIG. 6 is a diagram of another exemplary stage in an emission control driver according to an exemplary embodiment.

FIG. 6 is a diagram of another exemplary stage in an emission control driver according to an exemplary embodiment. Hereinafter, a g-th stage STg will be described below, and configurations and operations of the g-th stage STg may be identically applied to remaining stages.

Referring to FIG. 6, a circuit of the g-th stage STg in the emission control driver 160 according to the exemplary embodiment may include a first transistor Me1, a second transistor Me2, a third transistor Me3, a fourth transistor Me4, a fifth transistor Me5, a sixth transistor Me6, a seventh transistor Me7, an eighth transistor Me8, a ninth transistor Me9, a tenth transistor Me10, a first capacitor Ce1, a second capacitor Ce2, and a third capacitor Ce3.

The first transistor Me1 is connected between a third input terminal Ie3 and a first node Ne1, and may include a gate electrode connected to the first input terminal Ie1. The first transistor Me1 may be turned on or turned off according to a voltage level of the first input terminal Ie1.

The second transistor Me2 is connected between the second node Ne2 and the first input terminal Ie1, and may include a gate electrode connected to the first node Ne1. The second transistor Me2 may be turned on or turned off according to a voltage level of the first node Ne1.

The third transistor Me3 is connected between the second node Ne2 and a second voltage terminal Ve2, and may include a gate electrode connected to the first input terminal Ie1. The third transistor Me3 may be turned on or turned off according to a voltage level of the first input terminal Ie1.

The fourth transistor Me4 is connected between the first node Ne1 and a third node Ne3, and may include a gate electrode connected to the second input terminal Ie2. The fourth transistor Me4 may be turned on or turned off according to a voltage level of the second input terminal Ie2.

The fifth transistor Me5 is connected between the first voltage terminal Ve1 and the third node Ne3, and may include a gate electrode connected to the second node Ne2. The fifth transistor Me5 may be turned on or turned off according to a voltage level of the second node Ne2.

The sixth transistor Me6 is connected between a fourth node Ne4 and the second input terminal Ie2, and may include a gate electrode connected to the second node Ne2. The sixth transistor Me6 may be turned on or turned off according to a voltage level of the second node Ne2.

The seventh transistor Me7 is connected between a fourth node Ne4 and a fifth node Ne5, and may include a gate electrode connected to the second input terminal Ie2. The seventh transistor Me7 may be turned on or turned off according to a voltage level of the second input terminal Ie2.

The eighth transistor Me8 is connected between the first voltage terminal Ve1 and the fifth node Ne5, and may include a gate electrode connected to the first node Ne1. The eighth transistor Me8 may be turned on or turned off according to a voltage level of the first node Ne1.

A ninth transistor Me9 is connected between the first voltage terminal Ve1 and an output terminal OT, and may include a gate electrode connected to the fifth node Ne5. The ninth transistor Me9 may be turned on or turned off according to a voltage level of the fifth node Ne5.

A tenth transistor Ms10 is connected between the output terminal OT and the second voltage terminal Ve2, and may include a gate electrode connected to the first node Ne1. The tenth transistor Me10 may be turned on or turned off according to a voltage level of the first input terminal Ie1.

The output terminal OT may be connected to a g-th emission control line ELg.

The first capacitor Ce1 may be connected between the first node Ne1 and the second input terminal Ie2. The second capacitor Ce2 may be connected between the second node Ne2 and the fourth node Ne4. The third capacitor Ce3 may be connected between the first voltage terminal Ve1 and the fifth node Ne5.

The first voltage terminal Ve1 is connected to the first driving voltage line 301, and the second voltage terminal Ve2 is connected to a second driving voltage line 305.

The first voltage terminal Ve1 may be connected to the first driving voltage line 301 to receive the first driving voltage VGH. The second voltage terminal Ve2 may be connected to the second driving voltage line 305 to receive the second driving voltage VGL. At an odd-numbered stage, the first input terminal Ie1 is connected to the first clock line 401 to receive the first clock signal CK1, and the second input terminal Ie2 is connected to the second clock line 405 to receive the second clock signal CK2. At an even-numbered stage, the first input terminal Ie1 is connected to the second clock line 405 to receive the second clock signal CK2, and the second input terminal Ie2 is connected to the first clock line 401 to receive the first clock signal CK1. Among the plurality of stages ST1 to STn, a third input terminal Ie3 of a circuit in the first stage ST1 is connected to the starting signal line 601 to receive an input of a starting signal FLM. The third input terminal Ie3 in each of the other stages ST2 to STn than the first stage ST1 may be connected to a carry output terminal CR of a previous stage ST1 to STn-1 via the carry line 602 to receive a carry signal CARRY as a starting signal.

As shown in FIGS. 5 and 6, each of the plurality of stages ST1 to STn may include a pull-up switch Ms6 and Me9 for outputting a high voltage and a pull-down switch Ms7 and Me10 for outputting a low voltage. When the pull-up switch Ms6 and Me9 is turned off, the pull-down switch Ms7 and Me10 is turned on, and when the pull-down switch Ms7 and Me10 is turned off, the pull-up switch Ms6 and Me9 is turned on to operate the stage.

The capacitors Cs2 and Ce3 respectively connected to the nodes Ns3 and Ne5 that respectively turn on and turn off the pull-up switches Ms6 and Me9 of the plurality of stages ST1 to STn and the capacitors Cs1 and Ce1 respectively connected to the nodes Ns1 and Ne1 that respectively turn on and turn off the pull-down switches Ms7 and Me10 of the plurality of stages ST1 to STn have to be charged with an initial voltage simultaneously with starting of the operation. As such, a large in-rush current flows through the first driving voltage line 301 and the second driving voltage line 305.

As the first driving voltage line 301 and the second driving voltage line 305 are away from input ends of the first driving voltage VGH and the second driving voltage VGL, a voltage distortion occurs due to a voltage drop (IR-drop) and a signal delay (RC-delay).

Due to the in-rush current instantly flowing through the first driving voltage line 301 and the second driving voltage line 305 and the voltage drop (IR-drop) of the first driving voltage line 301 and the second driving voltage line 305, the first driving voltage VGH descends and the second driving voltage VGL rises. Accordingly, the capacitors Cs2 and Ce3 respectively connected to the nodes Ns3 and Ne5 and the capacitors Cs1 and Ce1 respectively connected to the nodes Ns1 and Ne1 may not be sufficiently initialized, and thus the pull-up switches Ms6 and Me9 and the pull-down switches Ms7 and Me10 may be simultaneously turned on and the first driving voltage VGH and the second driving voltage VGL may be short-circuited.

Figure 7:
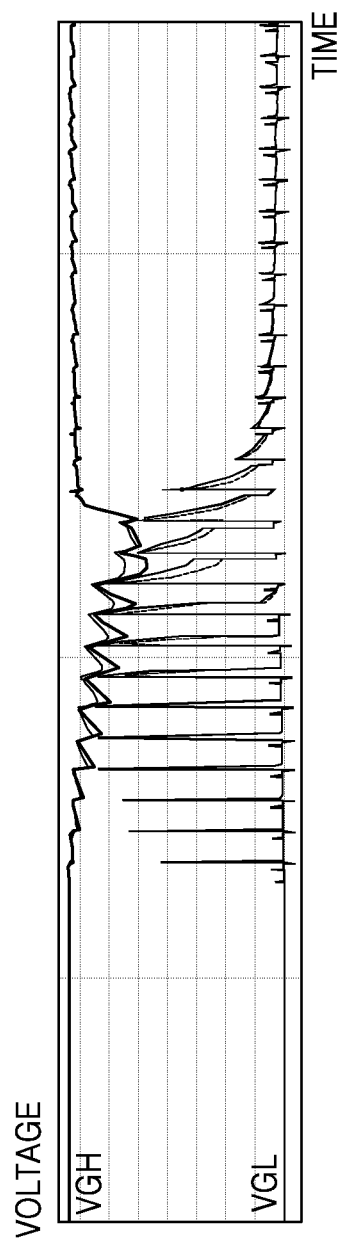
FIG. 7 is a graph of a simulation result of a short-circuit between a first driving voltage and a second driving voltage when a scan driver and/or an emission control driver start to drive.

FIG. 7 is a graph of a simulation result of a short-circuit between a first driving voltage and a second driving voltage when the scan driver 110 and/or the emission control driver 160 start to drive.

According to the embodiment, a hold capacitor is provided adjacent to stages of the driver in order to prevent or reduce occurrence of short-circuit between voltage lines when starting the driving of the driver.

Figure 8:
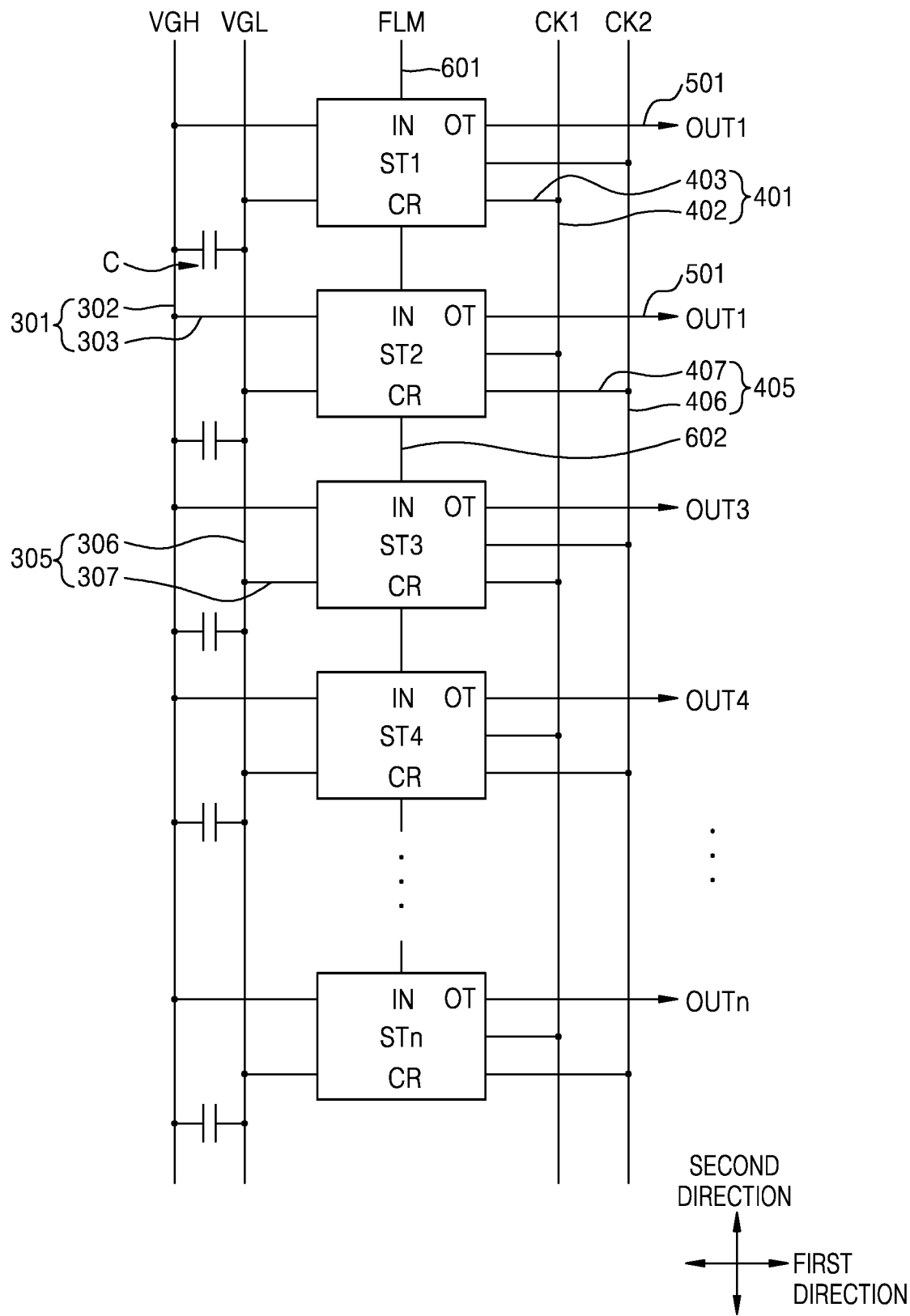
FIG. 8 is a block diagram of a scan driver and/or an emission control driver, according to an exemplary embodiment.

FIG. 8 is a block diagram of the scan driver 110 and the emission control driver 160 according to another exemplary embodiment.

Referring to FIG. 8, the scan driver 110 and/or the emission control driver 160 may include at least one hold capacitor C connected to at least one adjacent stage of the plurality of stages ST1 to STn.

The hold capacitor C may include a first electrode connected to the first driving voltage line 301 and a second electrode connected to the second driving voltage line 305.

The hold capacitor C may be charged by the first driving voltage VGH applied to the first driving voltage line 301 and the second driving voltage VGL applied to the second driving voltage line 305 before the starting signal FLM and the carry signal CARRY are applied to the plurality of stages ST1 to STn.

After charging the hold capacitor C, the starting signal FLM is applied to the plurality of stages ST1 to STn to operate the scan driver 110 and the emission control driver 160. When starting the operation, each of the plurality of stages ST1 to STn respectively charges the capacitors Cs2 and Ce3 respectively connected to the nodes Ns3 and Ne5 and the capacitors Cs1 and Ce1 respectively connected to the nodes Ns1 and Ne1 by using the hold capacitor C, and thus an instant voltage distortion caused by the voltage drop of the first driving voltage line 301 and the second driving voltage line 305 may be reduced and the short-circuit of the first driving voltage VGH and the second driving voltage VGL may be prevented or reduced.

Figure 9:
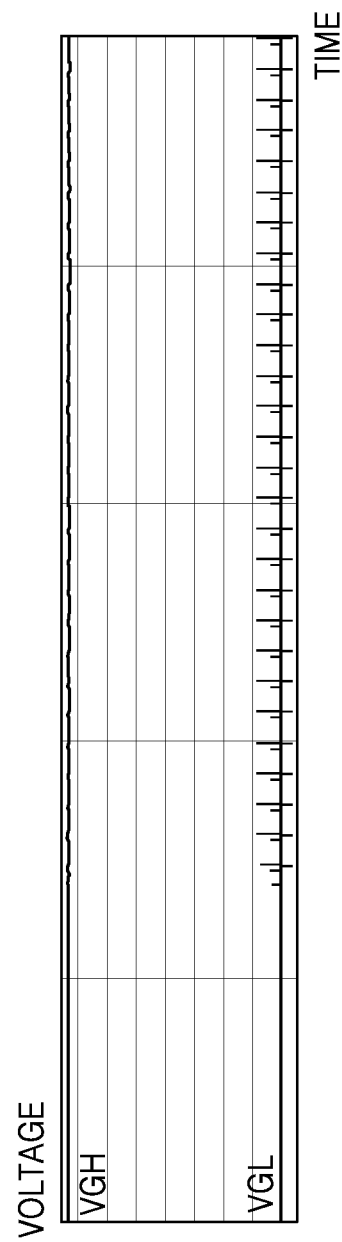
FIG. 9 is a graph of a simulation result showing that a first driving voltage and a second driving voltage are stably applied when a scan driver and/or an emission control driver include a hold capacitor.

FIG. 9 is a graph of a simulation result showing that the first driving voltage VGH and the second driving voltage VGL are stably applied when the scan driver 110 and/or the emission control driver 160 include the hold capacitor C.

FIGS. 10, 12, 13, 14, and 15 are plan views showing wirings of a scan driver and an emission control driver including examples of a hold capacitor of FIG. 8 implemented.

Figure 10:
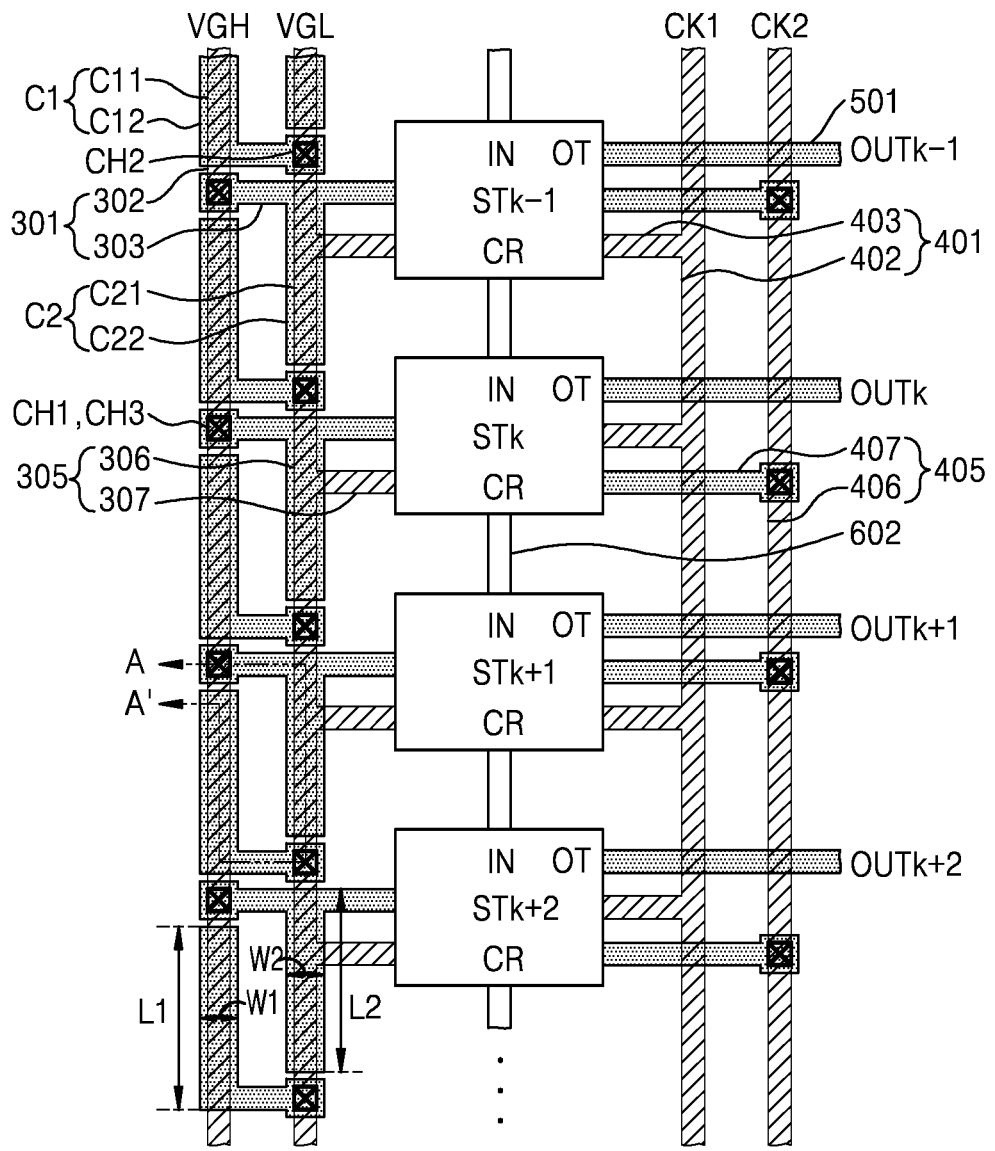
FIGS. 10, 12, 13, 14, and 15 are plan views showing wirings of a scan driver and an emission control driver including examples of a hold capacitor of FIG. 8 implemented.

Referring to FIG. 10, a first hold capacitor C1 and a second hold capacitor C2 may be connected to each of the plurality of stages ST1 to STn in parallel. The first hold capacitor C1 and the second hold capacitor C2 may be alternately arranged in the second direction. The first hold capacitor C1 and the second hold capacitor C2 may be arranged adjacent to each of the plurality of stages ST1 to STn.

The first hold capacitor C1 may include a first electrode C11 including a part of the first main line 302 of the first driving voltage line 301 and a second electrode C12 overlapping the first electrode C11. The first electrode C11 may be provided as a line shape that is a part of the first main line 302 of the first driving voltage line 301. The first electrode C11 may have a width that is equal to or greater than that of the first main line 302, a first length L1, defining a predetermined area. The second electrode C12 may be provided as a line shape along with the first main line 302. The second electrode C12 may have a first width W1 covering the first electrode C11, the first length L1, defining a predetermined area. The first width W1 may be equal to the width of the first main line 302 or the width of the first electrode C11. The second electrode C12 may be electrically connected to a part of the second main line 306 of the second driving voltage line 305 via a second contact hole CH2. The second main line 306 may be connected to each of the plurality of stages ST1 to STn via the second connecting line 307. Therefore, the first electrode C11 of the first hold capacitor C1 may be connected to the first driving voltage line 301, and the second electrode C12 may be connected to the second driving voltage line 305.

The second hold capacitor C2 may include a first electrode C21 including a part of the second main line 306 of the second driving voltage line 305 and a second electrode C22 overlapping the first electrode C21. The first electrode C21 may be provided as a line shape that is a part of the second main line 306 of the second driving voltage line 305. The first electrode C21 may have a width that is equal to or greater than that of the second main line 306, a second length L2, defining a predetermined area. The second electrode C22 may be provided as a line shape along with the second main line 306. The second electrode C22 may have a second width W2 covering the first electrode C21, the second length L2, defining a predetermined area. The second width W2 may be equal to the width of the second main line 306 or the width of the first electrode C21. The first width W1 and the second width W2 may be equal to or different from each other. The second electrode C22 may be electrically connected to a part of the first main line 302 of the first driving voltage line 301 via a third contact hole CH3. The second electrode C22 may extend from the first connecting line 303 of the first driving voltage line 301. That is, the second electrode C22 may include a part of the first connecting line 303 intersecting with the second main line 306, and the first connecting line 303 and the second electrode C22 may be integrally formed with each other. Therefore, the third contact hole CH3 may be equal to a first contact hole CH1.

The first main line 302 is connected to each of the plurality of stages ST1 to STn via the first connecting line 303. Therefore, the first electrode C21 of the second hold capacitor C2 may be connected to the second driving voltage line 305, and the second electrode C22 may be connected to the first driving voltage line 301.

Figure 11:
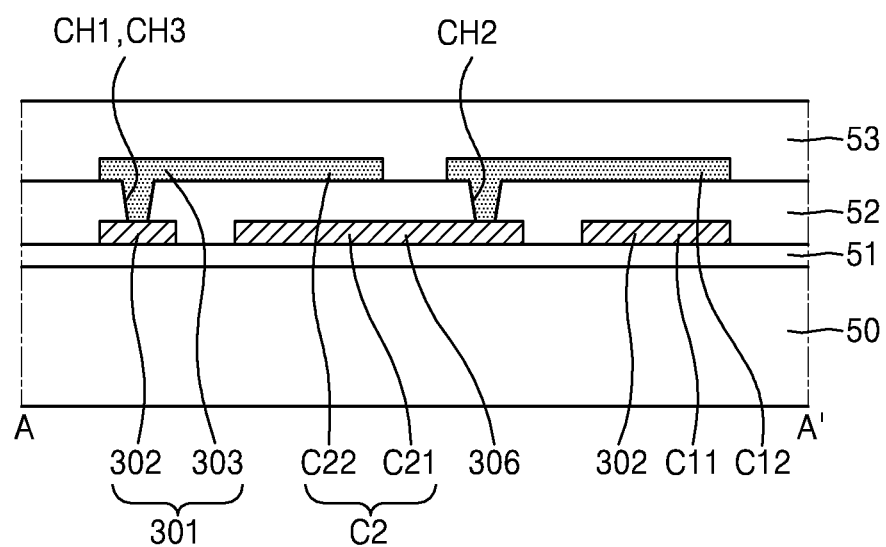
FIG. 11 is a cross-sectional view taken along a sectional line A-A' of FIG. 10.

FIG. 11 is a cross-sectional view taken along a sectional line A-A' of FIG. 10.

Referring to FIG. 11, a buffer layer 51 is disposed on a substrate 50, and the first main line 302 of the first driving voltage line 301, the second main line 306 and the second connecting line 307 of the second driving voltage line 305, the first electrode C11 of the first hold capacitor C1, and the first electrode C21 of the second hold capacitor C2 may be disposed on the buffer layer 51.

A first insulating layer 52 is disposed on the buffer layer 51, and the first connecting line 303 of the first driving voltage line 301, the second electrode C12 of the first hold capacitor C1, and the second electrode C22 of the second hold capacitor C2 may be disposed on the first insulating layer 52. A second insulating layer 53 may be on the first insulating layer 52. The first insulating layer 52 and the second insulating layer 53 may each have a single-layered or a multi-layered structure.

The first connecting line 303 of the first driving voltage line 301 may be electrically connected to the first main line 302 via the first contact hole CH1 of the first insulating layer 52. The second electrode C22 of the second hold capacitor C2 may be electrically connected to the first main line 302 via the third contact hole CH3. The first contact hole CH1 may be equal to the third contact hole CH3. The second electrode C12 of the first hold capacitor C1 may be electrically connected to the second main line 306 via the second contact hole CH2.

The first driving voltage line 301, the second driving voltage line 305, the first hold capacitor C1, and the second hold capacitor C2 may be disposed on the same layer as that of an electrode in a light-emitting device and a circuit device constituting the pixel PX. The first driving voltage line 301, the second driving voltage line 305, the first hold capacitor C1, and the second hold capacitor C2 may include the same material as that of an electrode in a light-emitting device and a circuit device constituting the pixel PX.

According to the exemplary embodiment illustrated with reference to FIG. 12, the first hold capacitor C1 or the second hold capacitor C2 may be connected to each of the plurality of stages ST1 to STn. The first hold capacitor C1 and the second hold capacitor C2 may be alternately arranged in the second direction. The first hold capacitor C1 and the second hold capacitor C2 may be arranged adjacent to each of the plurality of stages ST1 to STn.

Figure 12:
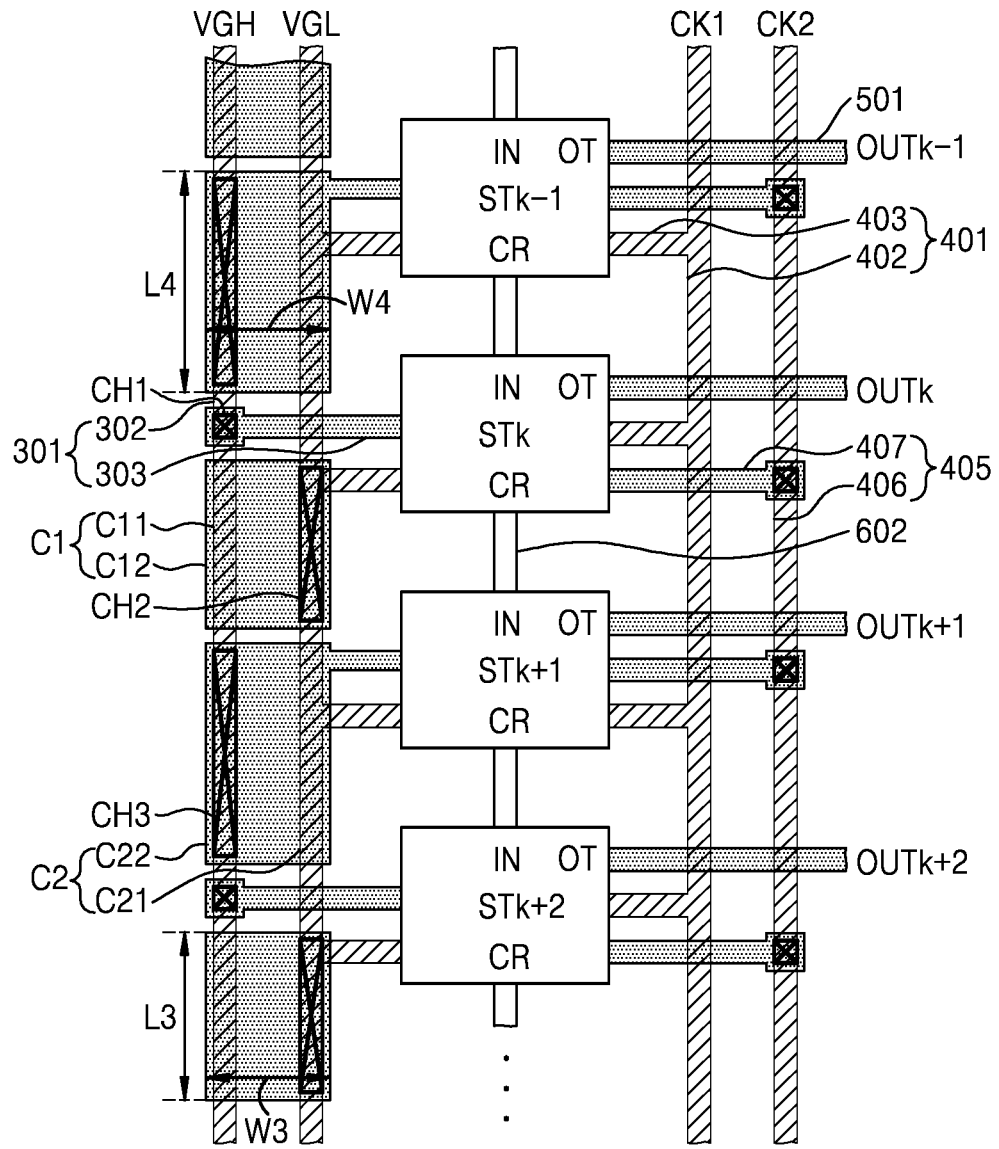

Referring to FIG. 12, the first hold capacitor C1 is connected to a k-th stage STk and a (k+2)-th stage STk+2, and the second hold capacitor C2 is connected to a (k−1)-th stage STk−1 and a (k+1)-th stage STk+1.

The first connecting line 303 of the first driving voltage line 301 may be disposed on the same layer as that of the second electrode C12 of the first hold capacitor C1 to be spaced therefrom, in the k-th stage STk and the (k+2)-th stage STk+2.

In the (k−1)-th stage STk−1 and the (k+1)-th stage STk+1, the second electrode C22 of the second hold capacitor C2 extends from the first connecting line 303 of the first driving voltage line 301, and thus the first connecting line 303 may be a part of the second electrode C22 of the second hold capacitor C2. The first connecting line 303 of the first driving voltage line 301 connected to the k-th stage STk and the (k+2)-th stage STk+2 may be provided between the first hold capacitor C1 and the second hold capacitor C2.

The first hold capacitor C1 may include a first electrode C11 including a part of the first main line 302 of the first driving voltage line 301 and a second electrode C12 overlapping the first electrode C11. The first electrode C11 may be provided as a line shape that is a part of the first main line 302 of the first driving voltage line 301. The first electrode C11 may have a width that is equal to or greater than that of the first main line 302, a third length L3, defining a predetermined area. The second electrode C12 may have a rectangular shape covering the first main line 302 and the second main line 306. The second electrode C12 may have a third width W3 covering the first electrode C11, the third length L3, defining a predetermined area. The third width W3 may be greater than the sum of the width of the first main line 302 and the width of the second main line 306. The second electrode C12 may be electrically connected to a part of the second main line 306 of the second driving voltage line 305 via a second contact hole CH2. The second main line 306 may be connected to each of the plurality of stages ST1 to STn via the second connecting line 307. Therefore, the first electrode C11 of the first hold capacitor C1 may be connected to the first driving voltage line 301, and the second electrode C12 may be connected to the second driving voltage line 305.

The second hold capacitor C2 may include a first electrode C21 including a part of the second main line 306 of the second driving voltage line 305 and a second electrode C22 overlapping the first electrode C21. The first electrode C21 may be provided as a line shape that is a part of the second main line 306 of the second driving voltage line 305. The first electrode C21 may have a width that is equal to or greater than that of the second main line 306, a fourth length L4, defining a predetermined area. The second electrode C22 may have a rectangular shape covering the first main line 302 and the second main line 306. The second electrode C22 may have a fourth width W4 covering the first electrode C21, the fourth length L4, defining a predetermined area. The fourth width W4 may be greater than the sum of the width of the first main line 302 and the width of the second main line 306. The third width W3 and the fourth width W4 may be equal to or different from each other. The second electrode C22 may be electrically connected to a part of the first main line 302 of the first driving voltage line 301 via the third contact hole CH3. The second electrode C22 may extend from the first connecting line 303 of the first driving voltage line 301. That is, the second electrode C22 may include a part of the first connecting line 303 intersecting with the second main line 306, and the first connecting line 303 and the second electrode C22 may be integrally formed with each other. Therefore, the third contact hole CH3 may be equal to the first contact hole CH1. The first main line 302 may be connected to each of the plurality of stages ST1 to STn via the first connecting line 303. Therefore, the first electrode C21 of the second hold capacitor C2 may be connected to the second driving voltage line 305, and the second electrode C22 may be connected to the first driving voltage line 301.

Figure 13:
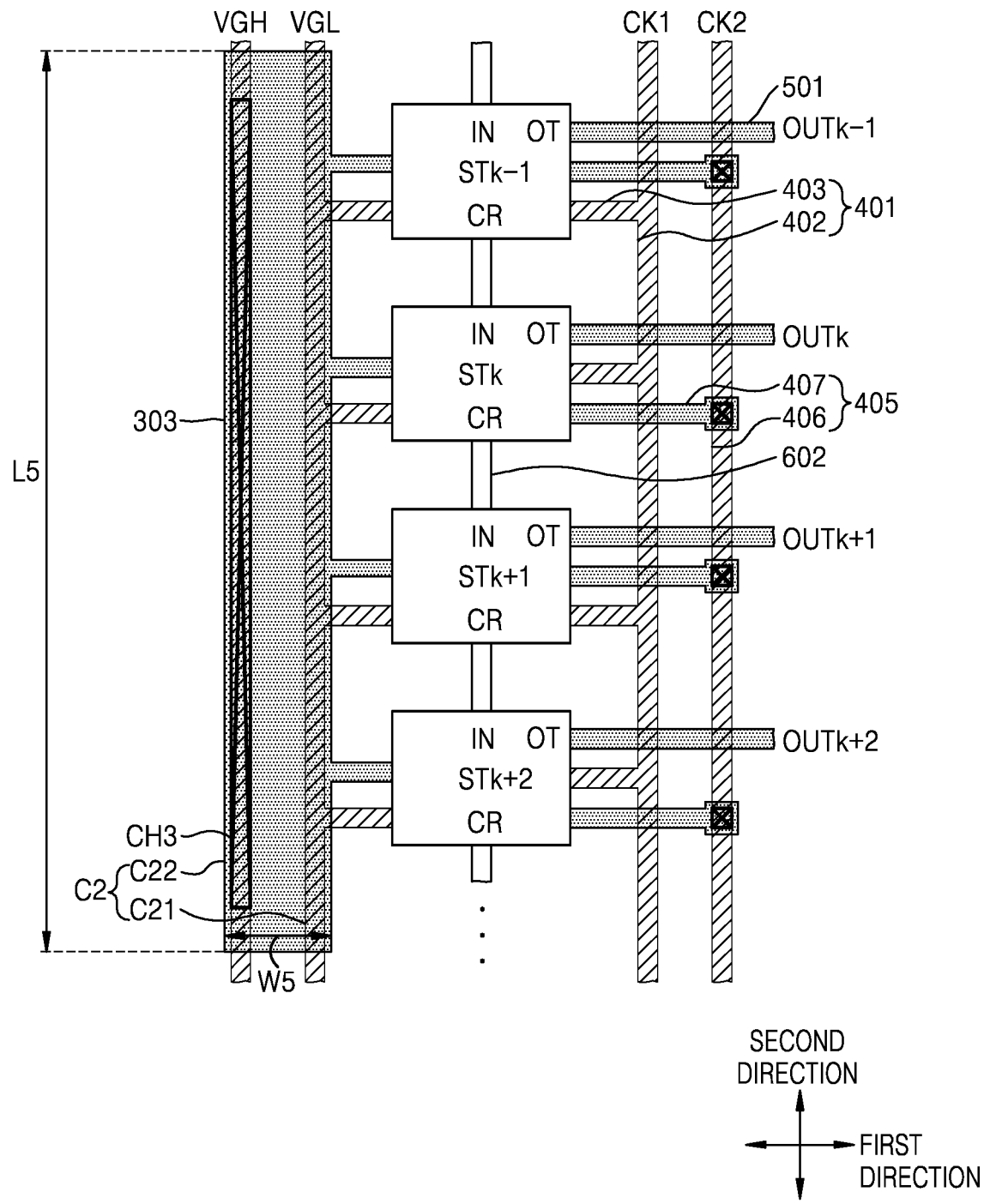

In the exemplary embodiment illustrated with reference to FIG. 13, the second hold capacitor C2 shared by one or more stages of the plurality of stages ST1 to STn may be arranged adjacent to the plurality of stages ST1 to STn.

The second hold capacitor C2 may include a first electrode C21 including a part of the second main line 306 of the second driving voltage line 305 and a second electrode C22 overlapping the first electrode C21. The first electrode C21 may be provided as a line shape that is a part of the second main line 306 of the second driving voltage line 305. The first electrode C21 may have a width that is equal to or greater than that of the second main line 306, a fifth length L5, defining a predetermined area. The second electrode C22 may have a rectangular shape covering the first main line 302 and the second main line 306. The second electrode C22 may have a fifth width W5 covering the first electrode C21, the fifth length L5, defining a predetermined area. The fifth width W5 may be greater than the sum of the width of the first main line 302 and the width of the second main line 306. The fifth length L5 may be a length extending along one or more stages in the second direction. The exemplary embodiment illustrated with reference to FIG. 13 shows an example of the second hold capacitor C2 that is shared by four stages and has the fifth length L5 extending along adjacent the four stages.

The second electrode C22 may be electrically connected to a part of the first main line 302 of the first driving voltage line 301 via the third contact hole CH3. The second electrode C22 may extend from at least one first connecting line 303 of the first driving voltage line 301. That is, the second electrode C22 may include a part of the first connecting line 303 intersecting with the second main line 306, and the at least one first connecting line 303 and the second electrode C22 may be integrally formed with each other. Therefore, the third contact hole CH3 may be equal to the first contact hole CH1. The first main line 302 may be connected to each of the plurality of stages ST1 to STn via the first connecting line 303. Therefore, the first electrode C21 of the second hold capacitor C2 may be connected to the second driving voltage line 305, and the second electrode C22 may be connected to the first driving voltage line 301.

Figure 14:
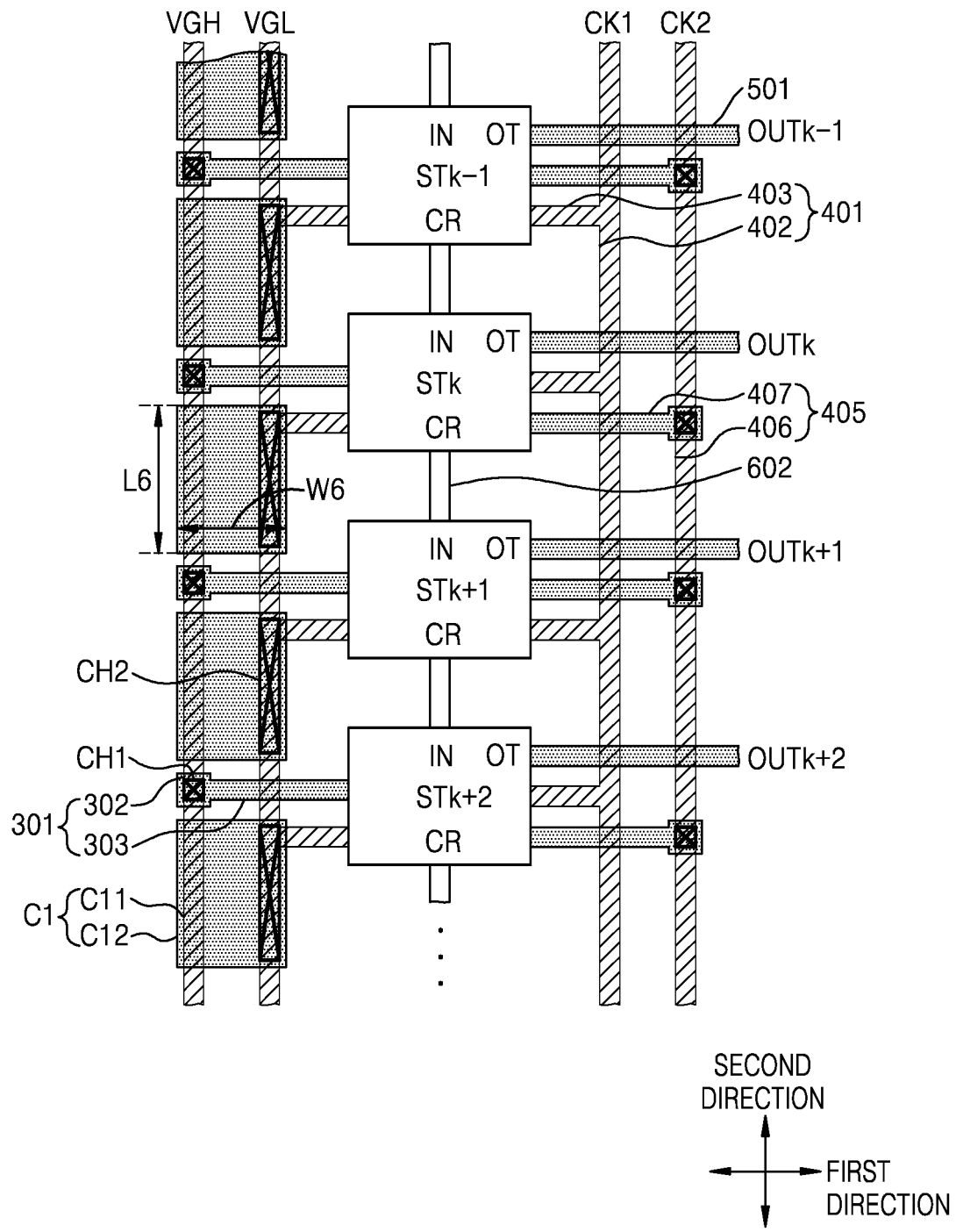

According to the exemplary embodiment illustrated with reference to FIG. 14, the first hold capacitor C1 may be connected to each of the plurality of stages ST1 to STn. The first hold capacitor C1 may be provided between adjacent first connecting lines 303.

The first hold capacitor C1 may include a first electrode C11 including a part of the first main line 302 of the first driving voltage line 301 and a second electrode C12 overlapping the first electrode C11. The first electrode C11 may be provided as a line shape that is a part of the first main line 302 of the first driving voltage line 301. The first electrode C11 may have a width that is equal to or greater than that of the first main line 302, a sixth length L6, defining a predetermined area. The second electrode C12 may have a rectangular shape covering the first main line 302 and the second main line 306. The second electrode C12 may have a sixth width W6 covering the first electrode C11, the sixth length L6, defining a predetermined area. The sixth width W6 may be greater than the sum of the width of the first main line 302 and the width of the second main line 306. The second electrode C12 may be electrically connected to a part of the second main line 306 of the second driving voltage line 305 via a second contact hole CH2. The second main line 306 may be connected to each of the plurality of stages ST1 to STn via the second connecting line 307. Therefore, the first electrode C11 of the first hold capacitor C1 may be connected to the first driving voltage line 301, and the second electrode C12 may be connected to the second driving voltage line 305.

Figure 15:
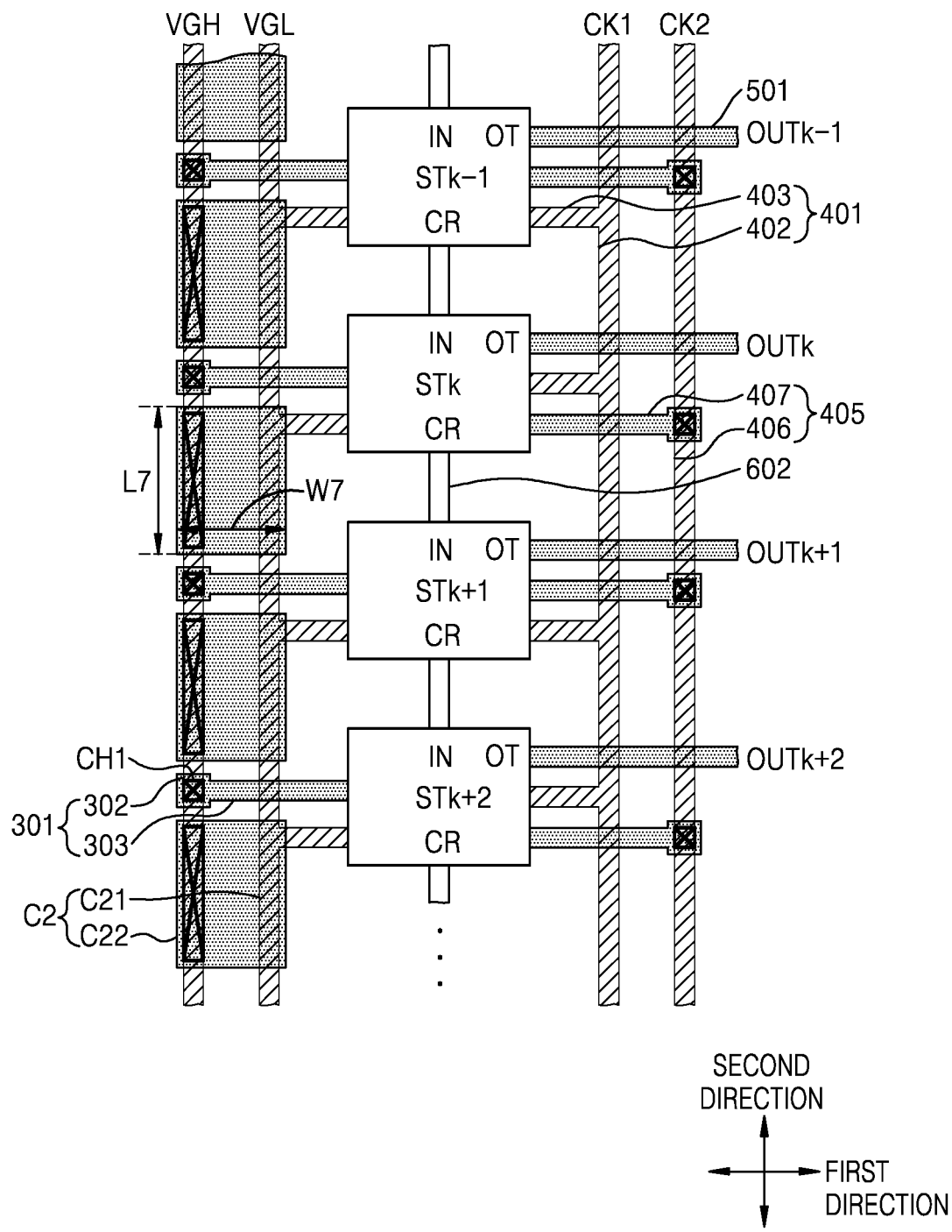

According to the exemplary embodiment illustrated with reference to FIG. 15, the second hold capacitor C2 may be connected to each of the plurality of stages ST1 to STn. The second hold capacitor C2 may be provided between adjacent first connecting lines 303.

The second hold capacitor C2 may include a first electrode C21 including a part of the second main line 306 of the second driving voltage line 305 and a second electrode C22 overlapping the first electrode C21. The first electrode C21 may be provided as a line shape that is a part of the second main line 306 of the second driving voltage line 305. The first electrode C21 may have a width that is equal to or greater than that of the second main line 306, a seventh length L7, defining a predetermined area. The second electrode C22 may have a rectangular shape covering the first main line 302 and the second main line 306. The second electrode C22 may have a seventh width W7 covering the first electrode C21, the seventh length L7, defining a predetermined area. The seventh width W7 may be greater than the sum of the width of the first main line 302 and the width of the second main line 306. The second electrode C22 may be electrically connected to a part of the first main line 302 of the first driving voltage line 301 via the third contact hole CH3. The first main line 302 may be connected to each of the plurality of stages ST1 to STn via the first connecting line 303. Therefore, the first electrode C21 of the second hold capacitor C2 may be connected to the second driving voltage line 305, and the second electrode C22 may be connected to the first driving voltage line 301.

Figure 16:
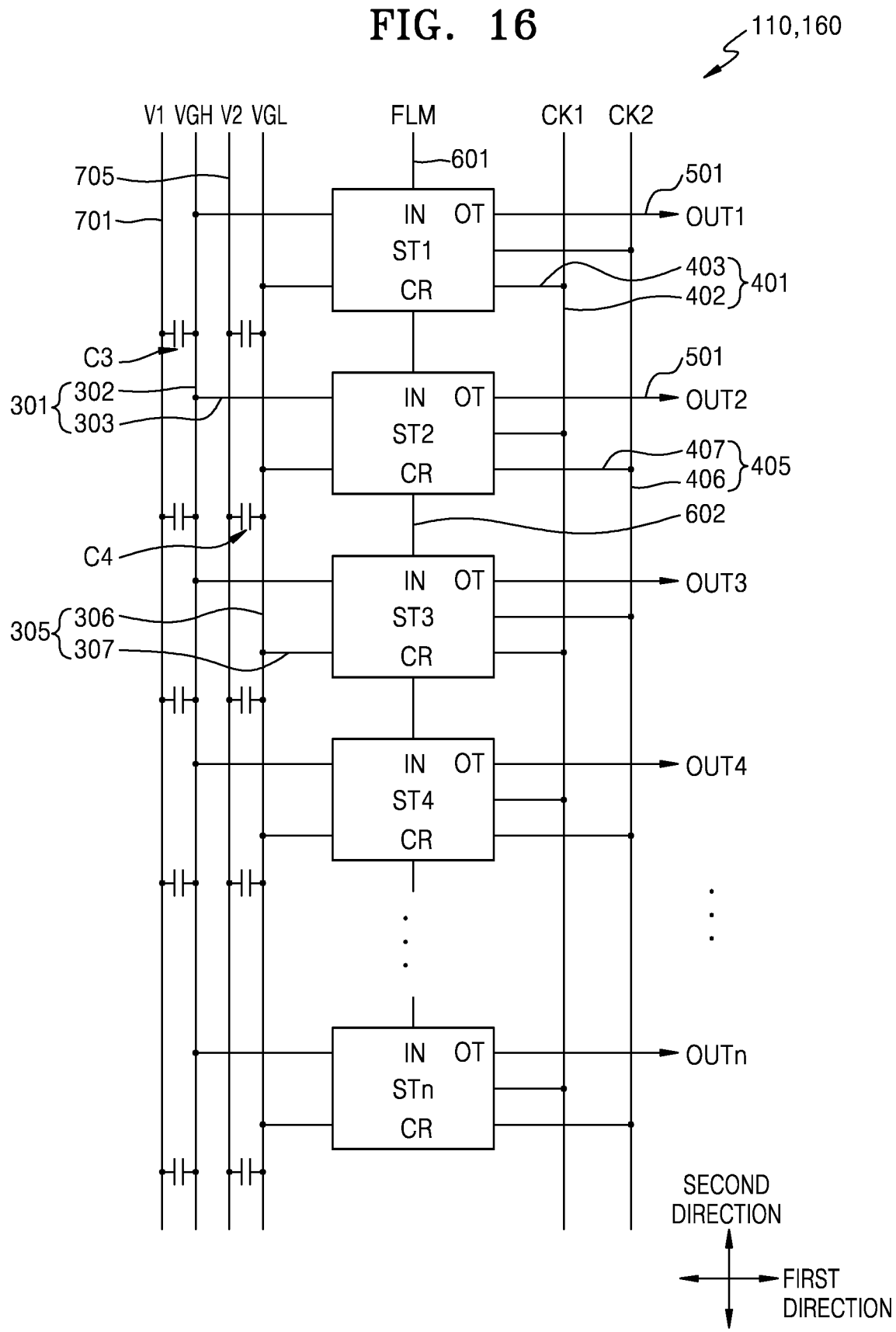
FIG. 16 is a block diagram of a scan driver and an emission control driver, according to an exemplary embodiment.

FIG. 16 is a block diagram of the scan driver 110 and the emission control driver 160 according to an exemplary embodiment.

Referring to FIG. 16, the scan driver 110 and the emission control driver 160 may include at least one third hold capacitor C3 and at least one fourth hold capacitor C4 connected to at least one adjacent stage of the plurality of stages ST1 to STn.

The third hold capacitor C3 may include a first electrode connected to the first driving voltage line 301 and a second electrode connected to a first direct current (DC) voltage line 701. The first DC voltage line 701 may be adjacent to the first driving voltage line 301 in parallel with each other. The first DC voltage line 701 may receive a first DC voltage V1 applied from the power supplier 30. In one exemplary embodiment, the first DC voltage V1 may be the first driving voltage VGH. In another exemplary embodiment, the first DC voltage V1 may be different from the first driving voltage VGH. The third hold capacitor C3 may be charged by the first driving voltage VGH applied to the first driving voltage line 301 and the first DC voltage V1 applied to the first DC voltage line 701 before the starting signal FLM and the carry signal CARRY are applied to the plurality of stages ST1 to STn.

The fourth hold capacitor C4 may include a first electrode connected to the second driving voltage line 305 and a second electrode connected to a second DC voltage line 705. The second DC voltage line 705 may be adjacent to the second driving voltage line 305 in parallel with each other. The second DC voltage line 705 may receive a second DC voltage V2 applied from the power supplier 30. In one exemplary embodiment, the second DC voltage V2 may be the second driving voltage VGL. In another exemplary embodiment, the second DC voltage V2 may be different from the second driving voltage VGL. The fourth hold capacitor C4 may be charged by the second driving voltage VGL applied to the second driving voltage line 305 and the second DC voltage V2 applied to the second DC voltage line 705 before the starting signal FLM and the carry signal CARRY are applied to the plurality of stages ST1 to STn.

The first DC voltage V1 and the second DC voltage V2 may each be one of the voltages supplied to the display units 10A and 10B.

Figure 17:
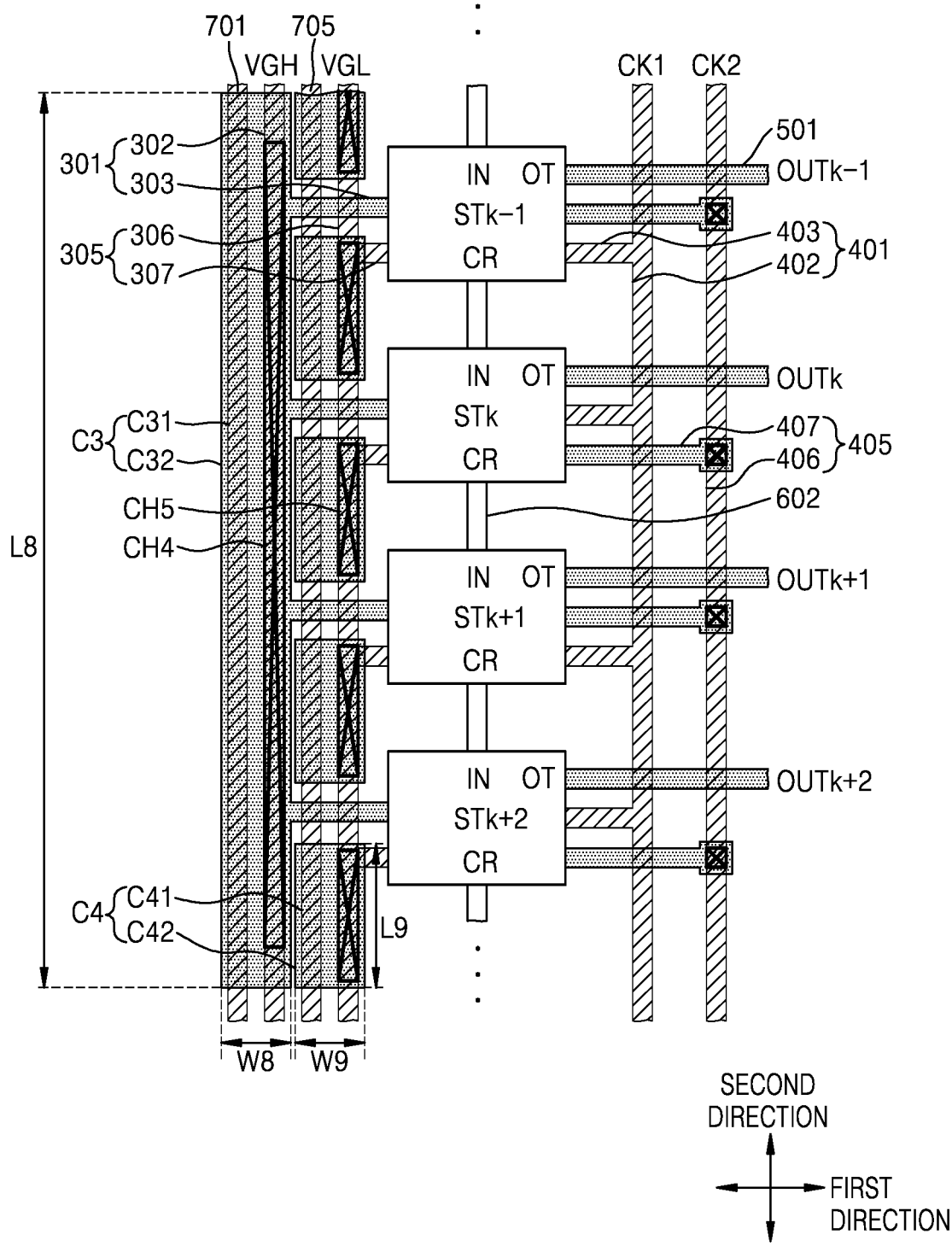
FIGS. 17 and 18 are plan views showing wirings of a scan driver and an emission control driver including examples of a hold capacitor of FIG. 16 implemented.
Figure 18:
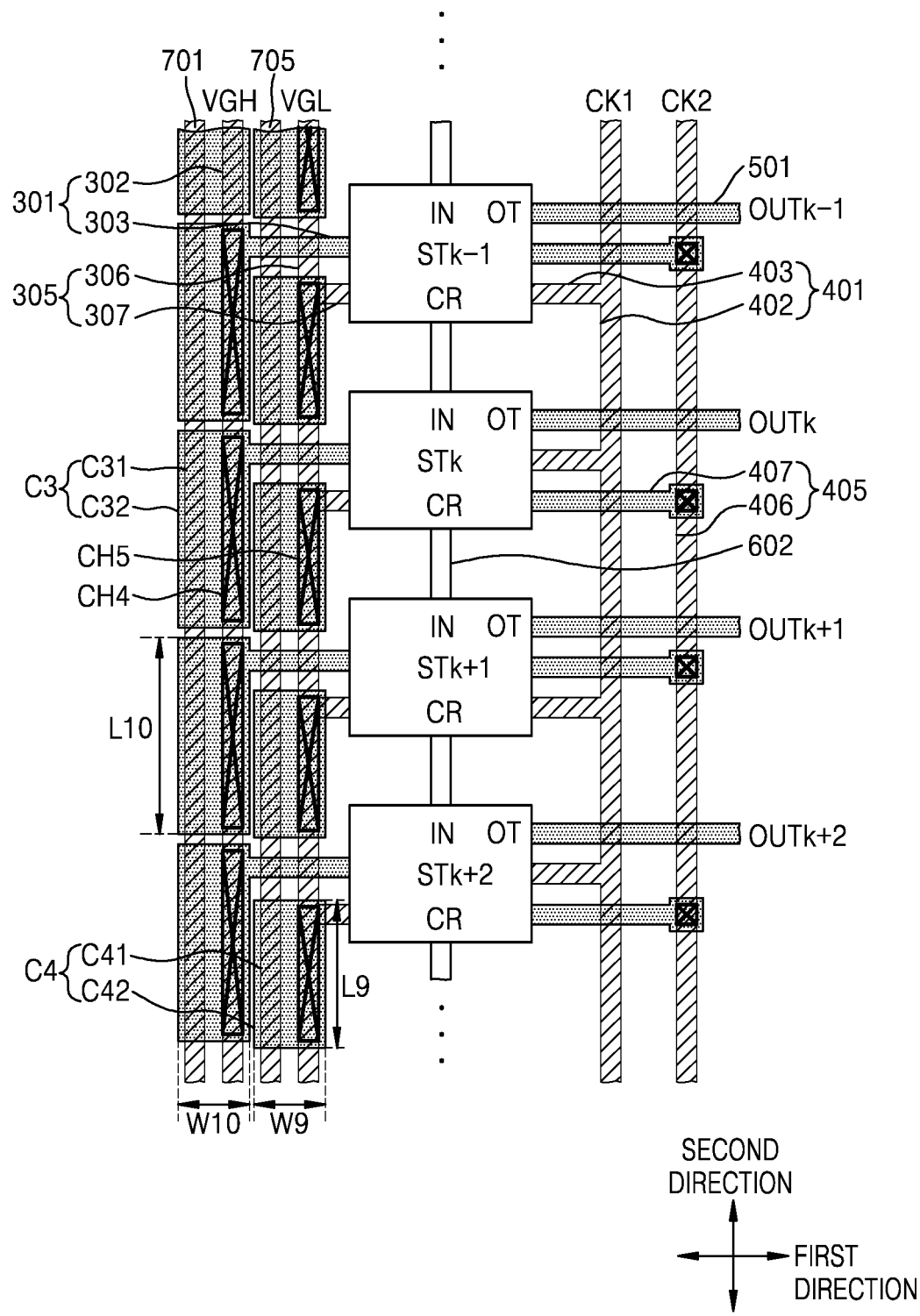

FIGS. 17 and 18 are plan views showing wirings of a scan driver and an emission control driver including examples of a hold capacitor of FIG. 16 implemented.

Referring to FIG. 17, the third hold capacitor C3 shared by one or more stages of the plurality of stages ST1 to STn may be arranged adjacent to the plurality of stages ST1 to STn. In addition, the fourth hold capacitor C4 may be connected to each of the plurality of stages ST1 to STn in parallel. The fourth hold capacitor C4 may be provided between adjacent first connecting lines 303.

The third hold capacitor C3 may include a first electrode C31 including a part of the first DC voltage line 701 and a second electrode C32 overlapping the first electrode C31. The first electrode C31 may has a line shape that is a part of the first DC voltage line 701. The first electrode C31 may have a width that is equal to or greater than that of the first DC voltage line 701, an eighth length L8, defining a predetermined area. The second electrode C32 may have a rectangular shape covering the first DC voltage line 701 and the first main line 302. The second electrode C32 may have an eighth width W8 covering the first electrode C31, the eighth length L8, defining a predetermined area. The eighth width W8 may be greater than the sum of the width of the first DC voltage line 701 and the width of the first main line 302. The eighth length L8 may be a length extending along one or more stages in the second direction. The exemplary embodiment illustrated with reference to FIG. 17 is an example of the third hold capacitor C3 having the eighth length L8 extending along adjacent four stages.

The second electrode C32 may be electrically connected to a part of the first main line 302 of the first driving voltage line 301 via a fourth contact hole CH4. The second electrode C32 and the first connecting line 303 of the first driving voltage line 301 may be integrally provided. Therefore, the fourth contact hole CH4 may be equal to the first contact hole CH1. The first main line 302 may be connected to each of the plurality of stages ST1 to STn via the first connecting line 303. Therefore, the first electrode C31 of the third hold capacitor C3 may be connected to the first DC voltage line 701, and the second electrode C32 may be connected to the first driving voltage line 301.

The fourth hold capacitor C4 may include a first electrode C41 including a part of the second DC voltage line 705 and a second electrode C42 overlapping the first electrode C41. The first electrode C41 may has a line shape that is a part of the second DC voltage line 705. The first electrode C41 may have a width that is equal to or greater than that of the second DC voltage line 705, a ninth length L9, defining a predetermined area. The second electrode C42 may have a rectangular shape covering the second DC voltage line 705 and the second main line 306. The second electrode C42 may have a ninth width W9 covering the first electrode C41, the ninth length L9, defining a predetermined area. The ninth width W9 may be greater than the sum of the width of the second DC voltage line 705 and the width of the second main line 306. The second electrode C42 may be electrically connected to a part of the second main line 306 of the second driving voltage line 305 via a fifth contact hole CH5. The second main line 306 may be connected to each of the plurality of stages ST1 to STn via the second connecting line 307. Therefore, the first electrode C41 of the fourth hold capacitor C4 may be connected to the second DC voltage line 705, and the second electrode C42 may be connected to the second driving voltage line 305.

The first DC voltage line 701 and the second DC voltage line 705 may be disposed on the same layer as those of the first main line 302 and the second main line 306. The first DC voltage line 701 and the second DC voltage line 705 may include the same material as that of the first main line 302 and the second main line 306.

Referring to FIG. 18, the third hold capacitor C3 and the fourth hold capacitor C4 may be connected to each of the plurality of stages ST1 to STn in parallel. The fourth hold capacitor C4 may be provided between adjacent first connecting lines 303.

The third hold capacitor C3 may include a first electrode C31 including a part of the first DC voltage line 701 and a second electrode C32 overlapping the first electrode C31. The first electrode C31 may has a line shape that is a part of the first DC voltage line 701. The first electrode C31 may have a width that is equal to or greater than that of the first DC voltage line 701, a tenth length L10, defining a predetermined area. The second electrode C32 may have a rectangular shape covering the first DC voltage line 701 and the first main line 302. The second electrode C32 may have a tenth width W10 covering the first electrode C31, the tenth length L10, defining a predetermined area. The tenth width W10 may be greater than the sum of the width of the first DC voltage line 701 and the width of the first main line 302. The second electrode C32 may be electrically connected to a part of the first main line 302 of the first driving voltage line 301 via a fourth contact hole CH4. The second electrode C32 and the first connecting line 303 of the first driving voltage line 301 may be integrally provided. Therefore, the fourth contact hole CH4 may be equal to the first contact hole CH1. The first main line 302 may be connected to each of the plurality of stages ST1 to STn via the first connecting line 303. Therefore, the first electrode C31 of the third hold capacitor C3 may be connected to the first DC voltage line 701, and the second electrode C32 may be connected to the first driving voltage line 301.

Since the fourth hold capacitor C4 is described above with reference to FIG. 17, detailed descriptions thereof are omitted here.

Figure 19:
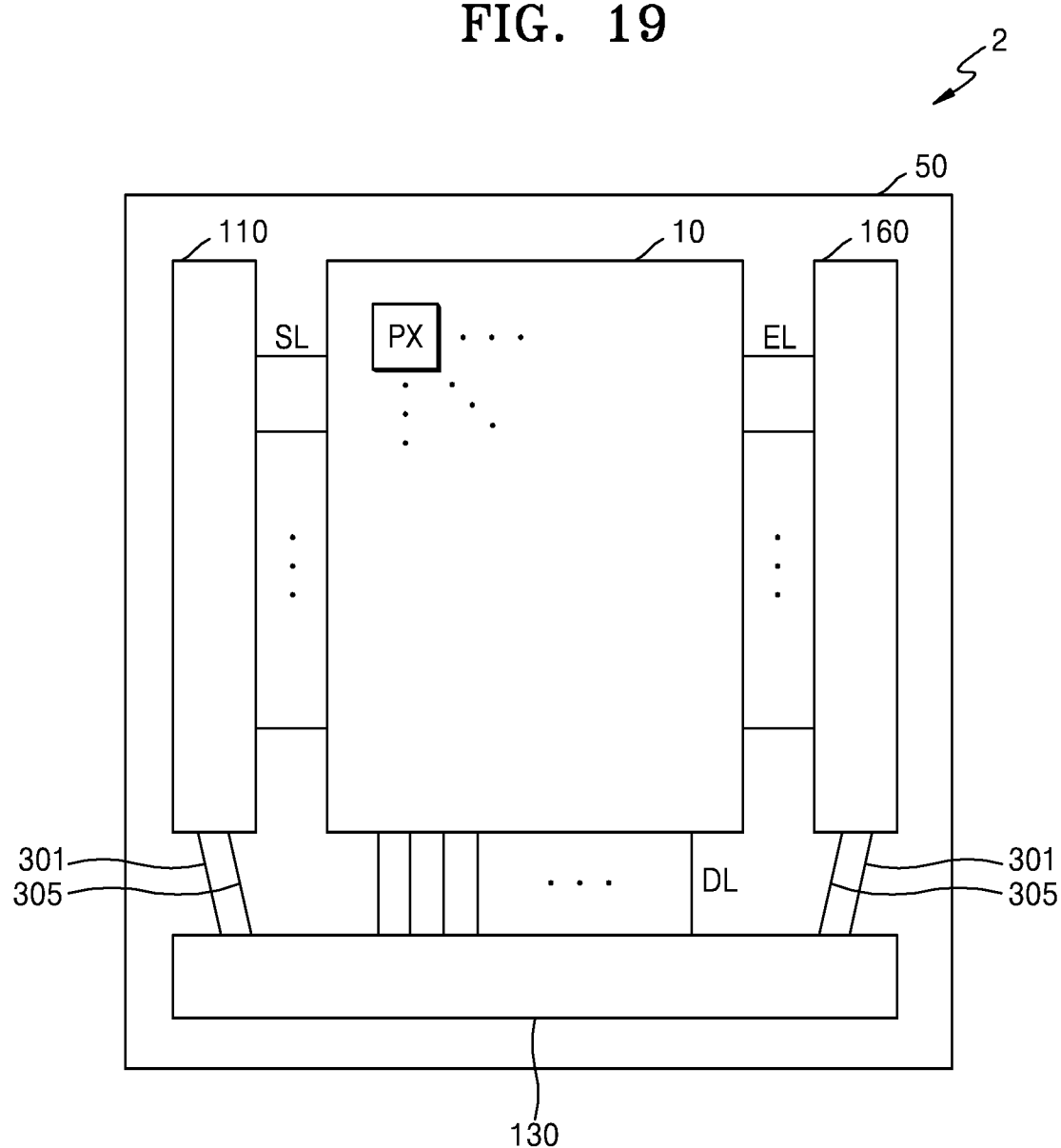
FIG. 19 is a diagram of a display apparatus according to an exemplary embodiment.

FIG. 19 is a diagram of a display apparatus 2 according to an exemplary embodiment. Descriptions provided above with reference to FIGS. 1 to 18 may be also applied to the display apparatus 2 of FIG. 19.

Referring to FIG. 19, the display apparatus 2 according to the exemplary embodiment may include a display unit 10 on a display area of the substrate 50, the scan driver 110 and/or the emission control driver 160 on a non-display area that is periphery of the display area. An integrated chip (IC) including the data driver 120, the controller 150, and the power supplier 30 may be mounted on a mounting area 130 of the non-display area.

The first driving voltage line 301 and the second driving voltage line 305 may extend from the power supplier 30 of the mounting area 130 to the scan driver 110 and the emission control driver 160 in the second direction. At least one of the plurality of stages of the scan driver 110 and the emission control driver 160 may include at least one hold capacitor. One electrode of the hold capacitor may be electrically connected to a part of at least one of the first driving voltage line 301 and the second driving voltage line 305. According to one exemplary embodiment (see FIGS. 10, 11, 12, 13, 14, and 15), the hold capacitor includes a first electrode being at least a part of one of the first driving voltage line 301 and the second driving voltage line 305. In another exemplary embodiment (see FIGS. 17 and 18), the hold capacitor includes a second electrode being at least a part of a DC voltage line to which an arbitrary DC voltage is applied.

Figure 20:
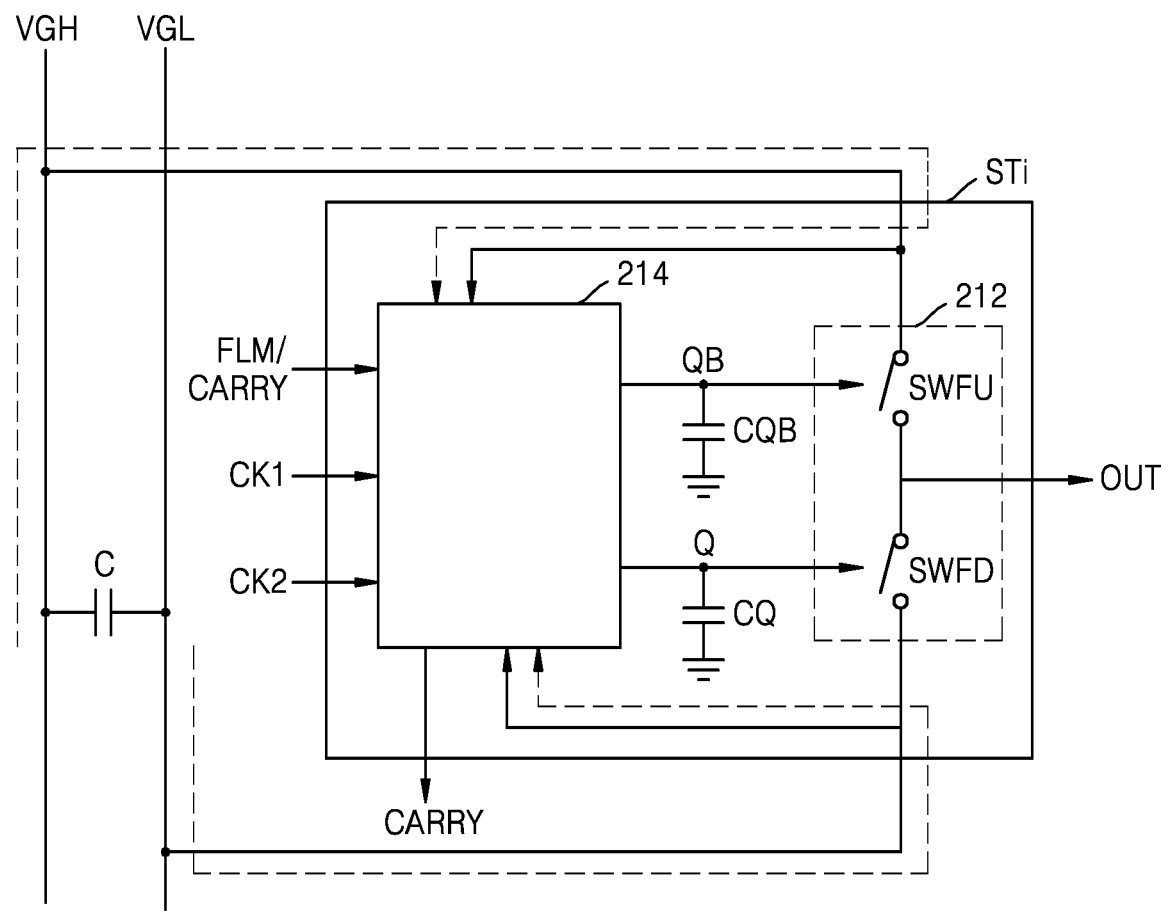
FIG. 20 is a diagram of an exemplary stage constituting a scan driver and an emission control driver of FIG. 19.

FIG. 20 is a diagram of an exemplary stage STi constituting the scan driver 110 and the emission control driver 160 of FIG. 19.

Referring to FIG. 20, the exemplary stage STi may include a buffer unit 212 including a pull-up switch SW-FU for outputting a high voltage and a pull-down switch SW-FD for outputting a low voltage, and a logic circuit unit 214 connected to the buffer unit 212. The logic circuit unit 214 may include a plurality of transistors and a plurality of capacitors.

The hold capacitor C may be charged by the first driving voltage VGH applied to the first driving voltage line 301 and the second driving voltage VGL applied to the second driving voltage line 305 before the starting signal FLM or the carry signal CARRY are applied to the stage STi.

After charging the hold capacitor C, the starting signal FLM or the carry signal CARRY is applied to each stage STi to operate the scan driver 110 and the emission control driver 160. The stage STi charges a capacitor C-QB connected to a node QB and a capacitor C-Q connected to a node Q by using the hold capacitor C when starting the operation, and thus, an instant voltage distortion due to the in-rush current and the voltage drop of the first driving voltage line 301 and the second driving voltage line 305 may be reduced and short-circuits of the first driving voltage VGH and the second driving voltage VGL may be prevented or reduced.

In this specification, gate lines may be used to mean the plurality of scan lines and the emission control lines, and gate signals may be used to mean the scan signals and the emission control signals.

The display apparatus according to the exemplary embodiment may be applied to a portable terminal such as a tablet personal computer (PC), a smartphone, a personal digital assistant (PDA), a portable multimedia player (PMP), a game console, an electronic device of a watch type, etc. The display apparatus may be used in a large-sized electronic apparatus such as a television or an external billboard, and a small-medium size electronic apparatus such as a PC, a laptop computer, a car navigation unit, and a camera, as well as the portable terminal. The display apparatus according to the exemplary embodiment may not be limited to the above examples, but may be adopted in other electronic devices without departing from a technical gist of the disclosure.

According to the exemplary embodiments, the voltage distortion in the wirings connected to the driver may be prevented or reduced to stably operate the driver, to thereby improve displaying characteristics of the display apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a substrate having a display area and a non-display area;
a plurality of gate lines extending in a first direction and disposed on the display area of the substrate; and
a driver disposed on the non-display area, the driver comprising:
a plurality of stages connected to the plurality of gate lines;
a first voltage line and a second voltage line that are connected to the plurality of stages to respectively supply a first direct current (DC) voltage and a second DC voltage to the plurality of stages; and at least one capacitor connected to at least one of the plurality of stages, the at least one capacitor comprising a pair of electrodes, wherein one of the electrodes is electrically connected to one of the first voltage line and the second voltage line, wherein the at least one capacitor comprises:

a first capacitor comprising:
  a first electrode including a part of the first voltage line extending in a second direction perpendicular to the first direction; and
  a second electrode electrically connected to the second voltage line and overlapping the first electrode along the first voltage line; and a second capacitor comprising:
  a third electrode including a part of the second voltage line extending in the second direction perpendicular to the first direction; and
  a fourth electrode electrically connected to the first voltage line and overlapping the third electrode along the second voltage line.

2. The display apparatus of claim 1, wherein the first voltage line comprises a first main line extending in the second direction and a plurality of first connecting lines extending in the first direction to connect the first main line to the plurality of stages, and wherein the second voltage line comprises a second main line extending in the second direction and a plurality of second connecting lines extending in the first direction to connect the second main line to the plurality of stages.

3. The display apparatus of claim 2, wherein the second electrode of the first capacitor comprises at least a portion of the first connecting lines intersecting the second main line.

4. The display apparatus of claim 2, wherein the at least one capacitor is provided between adjacent first connecting lines among the plurality of first connecting lines.

5. The display apparatus of claim 1, wherein the at least one capacitor is shared by at least two stages among the plurality of stages.

6. The display apparatus of claim 1, wherein the first capacitor and the second capacitor are alternately arranged in the second direction.

7. The display apparatus of claim 2, wherein at least one of the plurality of first connecting lines is arranged between the first capacitor and the second capacitor.

8. A display apparatus comprising:

a substrate having a display area and a non-display area;

a plurality of gate lines extending in a first direction and disposed on the display area of the substrate; and a driver disposed on the non-display area, the driver comprising:
  a plurality of stages connected to the plurality of gate lines;
  a first voltage line and a second voltage line that are connected to the plurality of stages to respectively supply a first direct current (DC) voltage and a second DC voltage to the plurality of stages; and
  at least one capacitor connected to at least one of the plurality of stages, the at least one capacitor comprising a pair of electrodes, wherein one of the electrodes is electrically connected to one of the first voltage line and the second voltage line, wherein the at least one capacitor comprises:

a first capacitor comprising:
  a first electrode including a part of the first voltage line extending in a second direction perpendicular to the first direction; and
  a second electrode electrically connected to the second voltage line and overlapping the first electrode along the first voltage line; and a second capacitor comprising:
  a third electrode including a part of the second voltage line extending in the second direction perpendicular to the first direction; and
  a fourth electrode electrically connected to the first voltage line and overlapping the third electrode along the second voltage line;

a third voltage line extending in parallel with the first voltage line, the third voltage line configured to receive a third DC voltage; and a fourth voltage line extending in parallel with the second voltage line, the fourth voltage line configured to receive a fourth DC voltage, wherein the at least one capacitor comprises:

a third capacitor comprising:
  a fifth electrode including a part of the third voltage line; and
  a sixth electrode electrically connected to the first voltage line and overlapping the fifth electrode along the third voltage line; and a fourth capacitor comprising:
  a seventh electrode including a part of the fourth voltage line; and
  an eighth electrode electrically connected to the second voltage line and overlapping the seventh electrode along the fourth voltage line.

9. The display apparatus of claim 8, wherein at least one of the third voltage line and the fourth voltage line are provided between the first voltage line and the second voltage line.

10. The display apparatus of claim 8, wherein the first DC voltage is equal to the third DC voltage.

11. The display apparatus of claim 8, wherein the second DC voltage is equal to the fourth DC voltage.

12. The display apparatus of claim 8, wherein at least one of the third capacitor and the fourth capacitor are shared by at least two stages among the plurality of stages.

13. The display apparatus of claim 8, wherein the third capacitor and the fourth capacitor are alternately arranged in the second direction.

14. A display apparatus comprising:

a plurality of stages arranged in a second direction on a substrate, the plurality of stages configured to transmit gate signals;

a first voltage line comprising:
  a first main line extending in the second direction; and
  a plurality of first connecting lines extending in a first direction perpendicular to the second direction, the plurality of first connecting lines disposed on a different layer from the first main line connecting the first main line to the plurality of stages, and configured to supply a first direct current (DC) voltage to the plurality of stages;

a second voltage line comprising:
  a second main line extending in the second direction and disposed on the same layer as the first main line; and
  a plurality of second connecting lines extending from the second main line in the first direction connecting the second main line to the plurality of stages, and configured to supply a second DC voltage to the plurality of stages; and at least one capacitor connected to at least one of the plurality of stages, the at least one capacitor comprising an electrode disposed on the same layer as the plurality of first connecting lines and electrically connected to one of the first main line and to the second main line, wherein the at least one capacitor comprises:

a first capacitor comprising:
   a first electrode including a part of the first main line; and
   a second electrode electrically connected to the second main line and overlapping the first electrode along the first main line; and a second capacitor comprising:
   a third electrode including a part of the second main line; and
   a fourth electrode electrically connected to the first main line and overlapping the third electrode along the second main line.

15. The display apparatus of claim 14, wherein at least one of the first capacitor and the second capacitor are shared by at least two stages among the plurality of stages.

16. A display apparatus comprising:

a plurality of stages arranged in a second direction on a substrate, the plurality of stages configured to transmit gate signals;

a first voltage line comprising:
   a first main line extending in the second direction; and
   a plurality of first connecting lines extending in a first direction perpendicular to the second direction, the plurality of first connecting lines disposed on a different layer from the first main line connecting the first main line to the plurality of stages, and configured to supply a first direct current (DC) voltage to the plurality of stages;

a second voltage line comprising:

a second main line extending in the second direction and disposed on the same layer as the first main line; and a plurality of second connecting lines extending from the second main line in the first direction connecting the second main line to the plurality of stages, and configured to supply a second DC voltage to the plurality of stages; and at least one capacitor connected to at least one of the plurality of stages, the at least one capacitor comprising an electrode disposed on the same layer as the plurality of first connecting lines and electrically connected to one of the first main line and to the second main line;

a third voltage line extending in parallel with the first voltage line, the third voltage line configured to receive a third DC voltage; and a fourth voltage line extending in parallel with the second voltage line, the fourth voltage line configured to receive a fourth DC voltage, wherein the at least one capacitor comprises:

a third capacitor comprising:
   a fifth electrode including a part of the third voltage line; and
   a sixth electrode electrically connected to the first main line and overlapping the fifth electrode along the third voltage line; and a fourth capacitor comprising:
   a seventh electrode including a part of the fourth voltage line; and
   an eighth electrode electrically connected to the second main line and overlapping the seventh electrode along the fourth voltage line.

17. The display apparatus of claim 16, wherein the first DC voltage is equal to the third DC voltage, and the second DC voltage is equal to the fourth DC voltage.

18. The display apparatus of claim 16, wherein at least one of the third capacitor and the fourth capacitor are shared by at least two stages among the plurality of stages.

* * * * *